US011088239B2

(12) United States Patent
Chang et al.

(10) Patent No.: US 11,088,239 B2
(45) Date of Patent: Aug. 10, 2021

(54) CAP STRUCTURE FOR TRENCH CAPACITORS

(71) Applicant: Taiwan Semiconductor Manufacturing Co., Ltd., Hsin-Chu (TW)

(72) Inventors: Yao-Wen Chang, Taipei (TW); Hai-Dang Trinh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 84 days.

(21) Appl. No.: 16/383,992

(22) Filed: Apr. 15, 2019

(65) Prior Publication Data
US 2020/0176552 A1    Jun. 4, 2020

Related U.S. Application Data

(60) Provisional application No. 62/773,345, filed on Nov. 30, 2018.

(51) Int. Cl.
*H01L 49/02* (2006.01)
*H01L 23/522* (2006.01)
*H01L 21/02* (2006.01)
*H01L 21/285* (2006.01)
*H01L 23/532* (2006.01)

(52) U.S. Cl.
CPC ........ *H01L 28/40* (2013.01); *H01L 21/02271* (2013.01); *H01L 21/2855* (2013.01); *H01L 23/5226* (2013.01); *H01L 23/5329* (2013.01)

(58) Field of Classification Search
CPC ............... H01L 28/40; H01L 21/02271; H01L 21/2855; H01L 23/5226; H01L 23/5329
See application file for complete search history.

(56) References Cited

U.S. PATENT DOCUMENTS 6,235,579 B1 * 5/2001 Lou ..................... H01L 21/7687
257/E21.011
6,258,689 B1 7/2001 Bronner et al.
(Continued)

FOREIGN PATENT DOCUMENTS

DE    102014100025 B3    2/2015
JP    2000269453 A    9/2000

*Primary Examiner* — Mohammad M Choudhry
(74) *Attorney, Agent, or Firm* — Eschweiler & Potashnik, LLC

(57) ABSTRACT

Various embodiments of the present application are directed towards a trench capacitor with a conductive cap structure. In some embodiments, the trench capacitor comprises a lower capacitor electrode, a capacitor dielectric layer overlying the lower capacitor electrode, and an upper capacitor electrode overlying the capacitor dielectric layer. The capacitor dielectric layer and the upper capacitor electrode are depressed into the substrate and define a gap sunken into the substrate. The conductive cap structure overlies and seals the gap on the upper capacitor electrode. In some embodiments, the conductive cap structure comprises a metal layer formed by physical vapor deposition (PVD) and further comprises a metal nitride layer formed overlying the metal layer by chemical vapor deposition (CVD). In other embodiments, the conductive cap structure is or comprises other suitable materials and/or is formed by other deposition processes.

20 Claims, 16 Drawing Sheets

(56) References Cited

U.S. PATENT DOCUMENTS

| | | |
|---|---|---|
| 6,552,380 B1 | 4/2003 | Sato et al. |
| 8,871,604 B2 | 10/2014 | Tu |
| 8,916,435 B2 | 12/2014 | Li et al. |
| 10,164,005 B2 | 12/2018 | Tsui et al. |
| 2003/0143322 A1 | 7/2003 | Ning |
| 2003/0214872 A1* | 11/2003 | Tu .................... H01L 27/10888 |
| | | 365/225 |
| 2004/0135182 A1 | 7/2004 | An et al. |
| 2005/0074943 A1 | 4/2005 | Lai et al. |
| 2010/0102363 A1* | 4/2010 | Hause .............. H01L 29/41775 |
| | | 257/288 |
| 2013/0062677 A1 | 3/2013 | Li et al. |
| 2013/0161792 A1 | 6/2013 | Tran et al. |
| 2013/0200489 A1 | 8/2013 | Huang et al. |
| 2013/0279102 A1 | 10/2013 | Brain |
| 2014/0248771 A1* | 9/2014 | Marsh ................ H01L 23/5223 |
| | | 438/674 |
| 2016/0020267 A1* | 1/2016 | Lin ...................... H01L 29/945 |
| | | 257/532 |
| 2016/0190230 A1* | 6/2016 | Krach .............. H01L 29/66181 |
| | | 257/532 |

* cited by examiner

CAP STRUCTURE FOR TRENCH CAPACITORS

REFERENCE TO RELATED APPLICATIONS

This application claims the benefit of U.S. Provisional Application No. 62/773,345, filed on Nov. 30, 2018. The contents of the above-referenced application are hereby incorporated by reference in their entirety.

BACKGROUND

Mobile phones and other mobile devices often rely upon ceramic capacitors and other passive devices discretely mounted to printed circuit boards (PCBs) of the mobile devices. However, this uses large amounts of surface area on the PCBs and hence limits mobile device size and/or mobile device functionality. Further, discretely mounting the passive devices increases manufacturing costs. Accordingly, mobile devices are increasingly turning to integrated passive devices (IPDs) to reduce size, reduce cost, and increase functionality. An IPD is a collection of one or more passive devices embedded into a single monolithic device and packaged as an integrated circuit (IC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
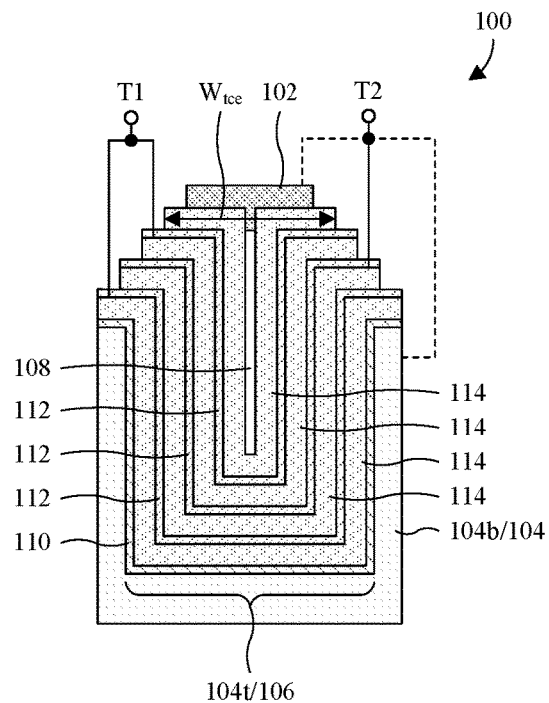
FIG. 1 illustrates a cross-sectional view of some embodiments of a trench capacitor comprising a conductive cap structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Trench capacitors may, for example, be embedded in integrated passive devices (IPDs) and used in place of ceramic capacitors to reduce the size of mobile devices, reduce the cost of mobile devices, increase the functionality of mobile devices, or any combination of the foregoing. During formation of a trench capacitor, a trench is formed in a substrate. Multiple electrodes and one or more dielectric layers are then alternatingly formed lining the trench. A challenge with the method is that a gap may form in the top electrode. For trench capacitors at an edge of a substrate, the corresponding gaps may trap photoresist used while forming (e.g., patterning) the electrodes since photoresist tends to be thicker at the edge of the substrate when formed by spin on coating. The trapped photoresist may lead to cracking and/or delamination of intermetal dielectric (IMD) layers and may hence lead to a low yield.

To prevent photoresist from becoming trapped in a gap of a trench capacitor, a dielectric (e.g., oxide) cap structure may be formed filling and sealing the gap. However, the dielectric cap structure poses challenges. The dielectric cap structure may, for example, be formed by atomic layer deposition (ALD). However, ALD is expensive and uses precursors. The precursors may become trapped in the gap and may fail to fully react (e.g., because of a high aspect ratio of the gap). The trapped precursors outgas, which may lead to cracking and/or delamination of the cap structure and/or other structures. The dielectric seal structure also places stress on the substrate and/or acts as an electrical barrier for contact vias extending from an overlying wire to the top electrode. As to the former, when the trench capacitor is formed in bulk over a large portion of the substrate, the stress may be sufficient to cause warping and/or cracking of the substrate and/or other structures on the substrate.

Various embodiments of the present application are directed towards a trench capacitor comprising a conductive cap structure and a corresponding method. In some embodiments, the method comprises patterning a substrate to form a trench, and subsequently forming a dielectric layer overlying the substrate and lining the trench. An electrode layer is formed overlying the dielectric layer and lining the trench over the dielectric layer. The electrode layer forms with a gap. A conductive cap layer is formed over the electrode layer and is formed covering and sealing the gap without filling the gap. The conductive cap layer is patterned to form a conductive cap structure overlying and sealing the gap. The electrode layer is then patterned to form an upper capacitor electrode underlying the conductive cap structure.

Because the conductive cap structure is conductive, the conductive cap structure does not serve as an electrical barrier for a contact via extending from an overlying wire to the upper capacitor electrode. Because the conductive cap structure only partially fills the gap, stress on the substrate from the conductive cap structure is minimal and the gap may deform to absorb stress on the substrate. Hence, warping and/or cracking of the substrate is less likely and/or warping and/or cracking of layers (e.g., IMD layers) on the substrate is less likely. Because the conductive cap structure seals the gap, the conductive cap structure prevents photoresist from building up in the gap. Because it would be difficult to remove the photoresist from the gap, if the gap is filled with the photoresist, the gap may not be able to absorb stress on the substrate and/or may impose stress on the substrate (e.g., due to a high coefficient of thermal expansion). Hence, because the conductive cap structure prevents photoresist from building up in the gap, the conductive cap structure may reduce warping and/or cracking of the substrate and/or reduce warping and/or cracking of layers on the substrate.

The conductive cap layer may, for example, be formed by depositing a first conductive layer by physical vapor deposition (PVD) and subsequently depositing a second conductive layer by metal-organic chemical vapor deposition (MOCVD). The first conductive layer seals the gap and, because PVD does not depend upon precursors, no precursors become trapped in the gap. Because there are no precursors trapped in the gap, outgassing from the gap is reduced and hence cracking and/or delamination of layers on the substrate is reduced. The second conductive layer may, for example, be resistant to oxidation and/or may, for example, protect the first conductive layer from oxidation so oxide does not form and serve as an electrical barrier for a contact via extending from an overlying wire to the upper capacitor electrode.

By forming the first conductive layer by PVD, the first conductive layer does not suffer from the "substrate" effect. The substrate effect refers to deposition at different rates for different substrates. With different deposition rates, a layer is formed thicker than it would otherwise be to compensate for the worst-case scenario, whereby material and money are wasted. Further, by forming of the first conductive layer and the second conductive layer respectively of titanium and titanium nitride, the first conductive layer may serve as a wetting layer for the second conductive layer during MOCVD. As a result, the second conductive layer also does not suffer from the substrate effect and material costs may be reduced. Note that other materials and/or deposition processes are amenable in alternative embodiments.

With reference to FIG. 1, a cross-sectional view 100 of some embodiments of a trench capacitor comprising a conductive cap structure 102 is provided. The trench capacitor may be, or may be part of, an integrated circuit (IC), an IPD, or some other semiconductor structure. The trench capacitor overlies a substrate 104 and has a trench segment 106 extending into a top of the substrate 104. The trench segment 106 fills a trench 104t defined by the substrate 104 and defines a gap 108 recessed into the substrate 104. The trench 104t may, for example, have a high aspect ratio (i.e., a high ratio of height to width). The high aspect ratio may, for example, be greater than about 25:1, about 30:1, about 20:1 to 40:1, or some other suitable value. The substrate 104 may be, for example, a bulk silicon substrate, a silicon-on-insulator (SOI) substrate, or some other suitable semiconductor substrate.

The gap 108 underlies and is sealed by the conductive cap structure 102 and may, for example, also be known as a cavity, an air gap, a gas-filled gap, a void, or some other suitable name. In some embodiments, the gap 108 is vacuum sealed and/or hermetically sealed by the conductive cap structure 102. In some embodiments, the gap 108 is filled with a gas comprising air, oxygen, nitrogen, argon, carbon dioxide, some other suitable gas(es), or any combination of the foregoing. The conductive cap structure 102 is conductive and may be or comprise, for example, a single material or multiple materials. In some embodiments, the conductive cap structure 102 is or comprises pure/elemental titanium, some other suitable metal(s), a metallic material, titanium nitride, tantalum nitride, some other suitable metal nitride(s), some other suitable conductive material(s), or any combination of the foregoing. In some embodiments, the conductive cap structure 102 comprises a lower conductive cap layer (not shown) and further comprises an upper conductive cap layer (not shown) overlying the lower conductive cap layer. The upper conductive cap layer may, for example, serve as an oxygen barrier to prevent oxygen from reaching and oxidizing the lower conductive cap layer. The lower conductive cap layer may, for example, be or comprise pure/elemental titanium or some other suitable conductive material. The upper conductive cap layer may, for example, be or comprise titanium nitride or some other suitable conductive oxygen barrier material. In some embodiments, the conductive cap structure 102 has a T-shaped profile or some other suitable profile.

By sealing the gap 108 without filling the gap 108, the gap 108 may deform to absorb stress on the substrate 104. As such, warping and/or cracking of the substrate 104 and/or warping and/or cracking of layers on the substrate 104 may be reduced. Further, by sealing the gap 108, the conductive cap structure 102 prevents photoresist from building up in the gap 108 during formation of the trench capacitor. Photoresist is difficult to remove from the gap 108. Further, photoresist in the gap 108 prevents the gap 108 from deforming to absorb stress on the substrate 104 and/or may imposes stress on the substrate 104 due to, for example, a high coefficient of thermal expansion. Hence, by preventing photoresist from building up in the gap 108, the conductive cap structure 102 may reduces stress on the substrate 104. This, in turn, may reduce warping and/or cracking of the substrate 104 and/or warping and/or cracking of layers on the substrate 104.

The trench capacitor comprises a dielectric liner layer 110, a plurality of capacitor dielectric layers 112, and a plurality of in-trench capacitor electrodes 114. The dielectric liner layer 110 lines an underside of the trench segment 106. The capacitor dielectric layers 112 and the in-trench capacitor electrodes 114 are alternatingly stacked over the dielectric liner layer 110, such that each of the in-trench capacitor electrodes 114 is spaced from each neighboring one of the in-trench capacitor electrodes 114 by a corresponding one of the capacitor dielectric layers 112. Further, the capacitor dielectric layers 112 and the in-trench capacitor electrodes 114 decrease in width $W_{tce}$ from a bottom of the trench capacitor to a top of the trench capacitor. In some embodiments, each of the capacitor dielectric layers 112 has the same width as an immediately underlying one of the in-trench capacitor electrodes 114. In alternative embodiments, each of the capacitor dielectric layers 112 has the same width as an immediately overlying one of the in-trench capacitor electrodes 114.

The dielectric liner layer 110 may, for example, be or comprise silicon oxide and/or some other suitable dielectric(s). The capacitor dielectric layers 112 may, for example, be or comprise silicon oxide, a high κ dielectric, some other suitable dielectric(s), or any combination of the foregoing. The high κ dielectric has a dielectric constant κ greater than that of silicon nitride and/or greater than about 10, 20, or 50. Other values are, however, amenable. The high κ dielectric may be or comprise, for example, hafnium oxide (e.g., HfO2), zirconium oxide (e.g., ZrO2), aluminum oxide (e.g., Al2O3), tantalum oxide (e.g., Ta2O5), titanium oxide (e.g., TiO2), some other suitable high κ dielectric(s), or any combination of the foregoing. The in-trench capacitor electrodes 114 may be or comprise, for example, doped polysilicon, titanium nitride (e.g., TiN), tantalum nitride (e.g., TaN), aluminum copper (e.g., AlCu), some other suitable metal(s) and/or material(s), or any combination of the foregoing. In some embodiments, the in-trench capacitor electrodes 114 each comprise a tantalum nitride layer and an aluminum copper layer stacked upon each other. In some embodiments, the in-trench capacitor electrodes 114 and the conductive cap structure 102 each are or comprise the same material, such as, for example, titanium nitride or some other suitable material.

The trench capacitor has a first terminal T1 and a second terminal T2. The first terminal T1 is electrically coupled to every other electrode of the in-trench capacitor electrodes 114, from a bottom of the trench capacitor to a top of the trench capacitor. Further, the second terminal T2 is electrically coupled to remaining electrode(s) of the in-trench capacitor electrodes 114. In some embodiments, the second terminal T2 is electrically coupled to a top electrode of the in-trench capacitor electrodes 114. Such electrical coupling may, for example, be through the conductive cap structure 102 or independent of the conductive cap structure 102. In other embodiments, the second terminal T2 is not electrically coupled to the top electrode. In some embodiments, the second terminal T2 is electrically coupled to the substrate 104. In such embodiments, a doped region of the substrate 104 to which the second terminal T2 is electrically coupled serves as an in-substrate capacitor electrode (e.g., a lower or bottom capacitor electrode) and the dielectric liner layer 110 serves as a capacitor dielectric layer. For example, a well region (not shown) in the substrate 104 may serve an in-substrate capacitor electrode and may, for example, have an opposite doping type (e.g., P-type or N-type) as a bulk of the substrate 104. As another example, a bulk region 104b of the substrate 104 may serve as an in-substrate capacitor electrode. In other embodiments, the second terminal T2 is not electrically coupled to the substrate 104.

Figure 2A:
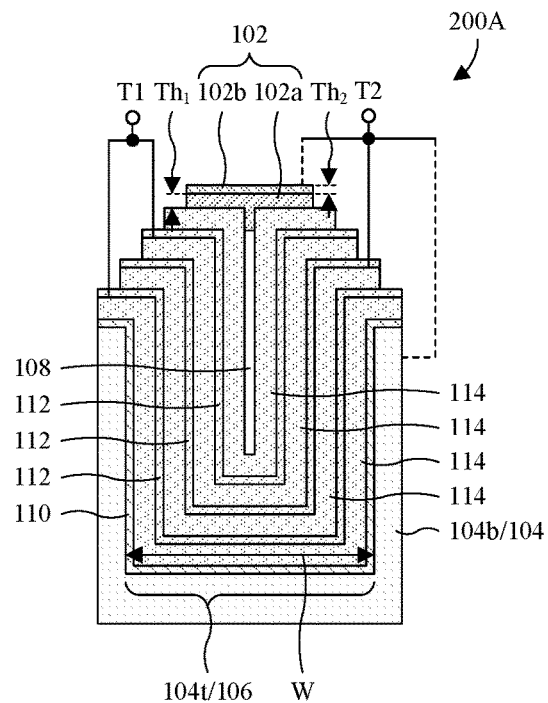
FIGS. 2A-2E illustrate cross-sectional views of various alternative embodiments of the trench capacitor of FIG. 1.

With reference to FIG. 2A, a cross-sectional view 200A of some alternative embodiments of the trench capacitor of FIG. 1 is provided in which the conductive cap structure 102 comprises a lower conductive cap layer 102a and an upper conductive cap layer 102b. The upper conductive cap layer 102b may, for example, be resistant to oxidation compared to the lower conductive cap layer 102a, such that the upper conductive cap layer 102b depends upon more energy to oxidize compared to the lower conductive cap layer 102a. Additionally, or alternatively, the upper conductive cap layer 102b may, for example, block oxygen from diffusing or otherwise moving through the upper conductive cap layer 102b to the lower conductive cap layer 102a. Hence, the upper conductive cap layer 102b may, for example, serve as a barrier to prevent oxidation of the lower conductive cap layer 102a.

In some embodiments, the lower conductive cap layer 102a is pure/elemental titanium or some other suitable metal and/or the upper conductive cap layer 102b is or comprises titanium nitride, tantalum nitride, some other suitable oxygen barrier material, or any combination of the foregoing. In some embodiments, the upper conductive cap layer 102b and the in-trench capacitor electrodes 114 are or comprise the same material, such as, for example, titanium nitride or some other suitable material. In some embodiments, the upper conductive cap layer 102b is or comprises a metal nitride and/or a metallic material, whereas the lower conductive cap layer 102a is or comprises a metal. In some embodiments, the upper conductive cap layer 102b and the lower conductive cap layer 102a share a metal element, such as, for example, titanium, tantalum, or some other suitable metal element. In some embodiments, the lower conductive cap layer 102a has a T-shaped profile or some other suitable profile, and/or the upper conductive cap layer 102b has a rectangular profile or some other suitable profile.

In some embodiments, the lower conductive cap layer 102a has a first thickness $Th_1$ that is about 400 angstroms, between about 350-450 angstroms, between about 350-400 angstroms, or between about 400-450 angstroms. Other values are, however, amenable. If the first thickness $Th_1$ is too small (e.g., less than about 350 angstroms or some other suitable value), the lower conductive cap layer 102a may be unable to hermetically seal the gap 108 and/or may be prone to collapse into the gap 108. If the first thickness $Th_1$ is too large (e.g., more than about 450 angstroms or some other suitable value), material may be wasted. In some embodiments, the upper conductive cap layer 102b has a second thickness $Th_2$ that is about 100 angstroms, between about 50-150 angstroms, between about 50-100 angstroms, or between about 100-150 angstroms. Other values are, however, amenable. If the second thickness $Th_2$ is too small (e.g., less than about 50 angstroms or some other suitable value), the upper conductive cap layer 102b may be unable to protect the lower conductive cap layer 102a from oxidation. For example, oxygen may pass through the upper conductive cap layer 102b to the lower conductive cap layer 102a. If the second thickness $Th_2$ is too large (e.g., more than about 150 angstroms or some other suitable value), material may be wasted.

In some embodiments, a width W of the trench segment 106 is about 0.2-0.6 micrometers, about 0.2-0.4 micrometers, about 0.4-0.6 micrometers, about 0.4 micrometers, or about 0.3 micrometers. In some embodiments, a width W of the trench segment is about 4-8 times, about 4-6 times, about 6-8 times, about 6 times, or about 8 times a total thickness of the conductive cap structures 102. The total thickness of the conductive cap structures 102 may, for example, correspond to the sum of the first and second thicknesses $Th_1$, $Th_2$.

Figure 2B:
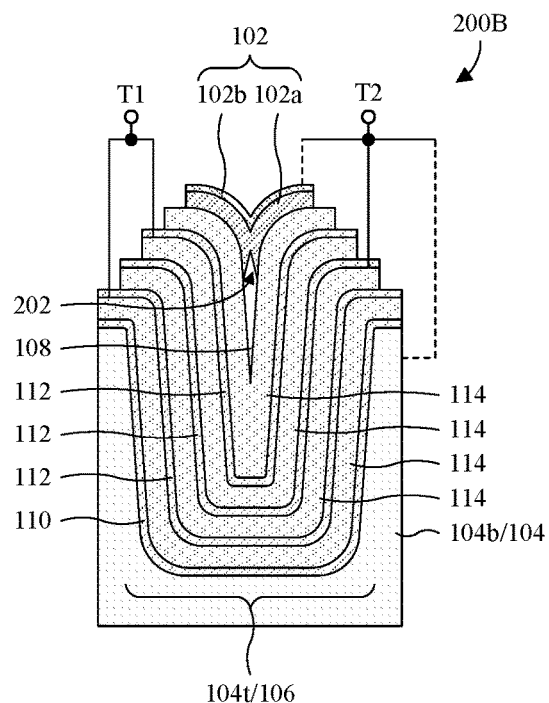

With reference to FIG. 2B, a cross-sectional view 200B of some alternative embodiments of the trench capacitor of FIG. 2A is provided in which sidewalls of the trench 104t and sidewalls of the trench segment 106 are angled. Further, the dielectric liner layer 110, the capacitor dielectric layers 112, the in-trench capacitor electrodes 114, and the conductive cap structure 102 are each curved around corners of underlying layers and/or structures. In some embodiments, a bottom surface of the conductive cap structure 102 has an indent due to the angled sidewalls and/or the way the conductive cap structure 102 is formed.

Figure 2C:
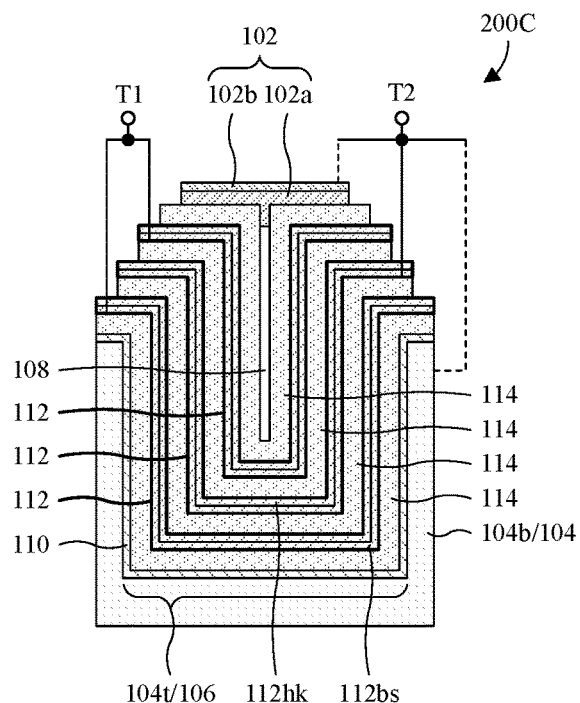

With reference to FIG. 2C, a cross-sectional view 200C of some alternative embodiments of the trench capacitor of FIG. 2A is provided in which the capacitor dielectric layers 112 each comprise a base capacitor dielectric layer 112bs and a high κ capacitor dielectric layer 112hk. Note that the base capacitor dielectric layer 112bs is only labeled for one of the capacitor dielectric layers 112 and the high κ capacitor dielectric layer 112hk is similarly only labeled for one of the capacitor dielectric layers 112. The high κ capacitor dielectric layer 112hk overlies and contacts the base capacitor dielectric layer 112bs and is or comprises a high κ dielectric. The high κ dielectric has a dielectric constant κ greater than that of silicon nitride and/or greater than about 10, 20, or 50. The high κ dielectric may be or comprise, for example, hafnium oxide, zirconium oxide, aluminum oxide, tantalum oxide, titanium oxide, some other suitable high κ dielectric(s), or any combination of the foregoing.

The base capacitor dielectric layer 112bs is or comprises a material with a dielectric constant κ less than or about 10, 6, or 3.9. For example, the base capacitor dielectric layer 112bs may be or comprise silicon oxide, silicon nitride, some other suitable dielectric, or any combination of the foregoing. Further, the base capacitor dielectric layer 112bs has a dielectric constant κ less than that of the high κ capacitor dielectric layer 112hk. The base capacitor dielectric layer 112bs provides enhanced electrical insulation between corresponding electrodes to reduce leakage current, thereby enhancing performance and power efficiency.

While FIG. 2C does not describe the dielectric liner layer 110 as being or comprising a high κ dielectric material, the dielectric liner layer 110 may be or comprise a high κ dielectric material in some embodiments. For example, the dielectric liner layer 110 may comprise a base dielectric liner layer (not shown) and a high κ dielectric liner layer (not shown). The high κ dielectric liner layer and the base dielectric liner layer may, for example, respectively be as the high κ capacitor dielectric layer 112hk and base capacitor dielectric layer 112bs are illustrated and/or described. These embodiments may, for example, arise when the second terminal T2 is electrically coupled to the substrate 104 and hence the dielectric liner layer 110 is serving as a capacitor dielectric layer for an in-substrate capacitor electrode.

Figure 2D:
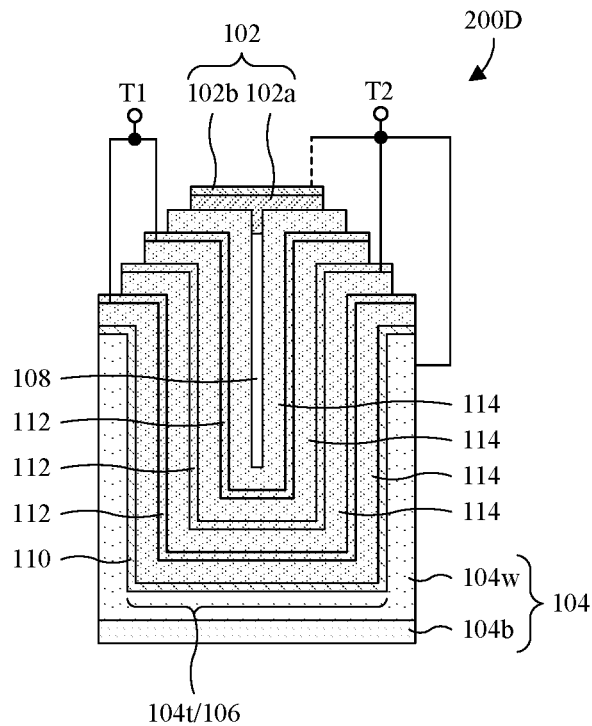

With reference to FIG. 2D, a cross-sectional view 200D of some alternative embodiments of the trench capacitor of FIG. 2A is provided in which the substrate 104 comprises a well region 104w. The well region 104w defines an in-substrate capacitor electrode (e.g., a lower or bottom capacitor electrode) and is electrically coupled to the second terminal T2. Further, the well region 104w overlies a bulk region 104b of the substrate 104. The well region 104w has a different doping type and/or a different doping concentration than the bulk region 104b. For example, the bulk region 104b and the well region 104w may respectively be p type and n type or vice versa.

Figure 2E:
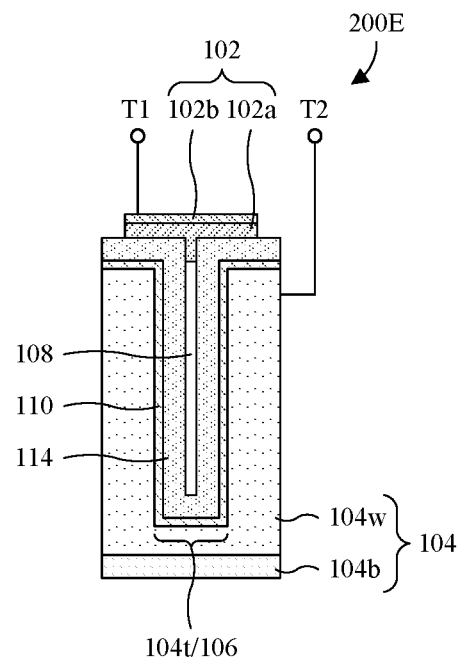

While FIGS. 1 and 2A-2D are illustrated with four in-trench capacitor electrodes 114 stacked on the substrate 104, more or less in-trench capacitor electrodes may be stacked on the substrate 104 in alternative. For example, with reference to FIG. 2E, a cross-sectional view 200E of some alternative embodiments of the trench capacitor of FIG. 2D is provided in which the trench capacitor has a single in-trench capacitor electrode 114 on the substrate 104. In the alternative embodiments of FIG. 2E, the well region 104w defines an in-substrate capacitor electrode (e.g., a lower or bottom capacitor electrode) and the dielectric liner layer 110 serves as a capacitor dielectric layer.

While the capacitor dielectric layers 112 in FIGS. 1, 2A, 2B, 2D, and 2E are illustrated as single-layer capacitor dielectric layers, the capacitor dielectric layers 112 may be multilayer capacitor dielectric layers as illustrated and described in FIG. 2C in alternative embodiments. While the dielectric liner layer 110, the capacitor dielectric layers 112, the in-trench capacitor electrodes 114, and the conductive cap structure 102 are illustrated as being rectilinear in FIGS. 1, 2A, and 2C-2E, such components may be curved as illustrated and described in FIG. 2B in alternative embodiments. While the substrate 104 in FIGS. 1 and 2A-2C is illustrated without a well region, the substrate 104 may comprise the well region 104w of FIGS. 2D and 2E in alternative embodiments. In such alternative embodiments, the well region 104w and the dielectric liner layer 110 may respectively serve as a capacitor electrode (i.e., an in-substrate capacitor electrode) and a capacitor dielectric layer.

Figure 3A:
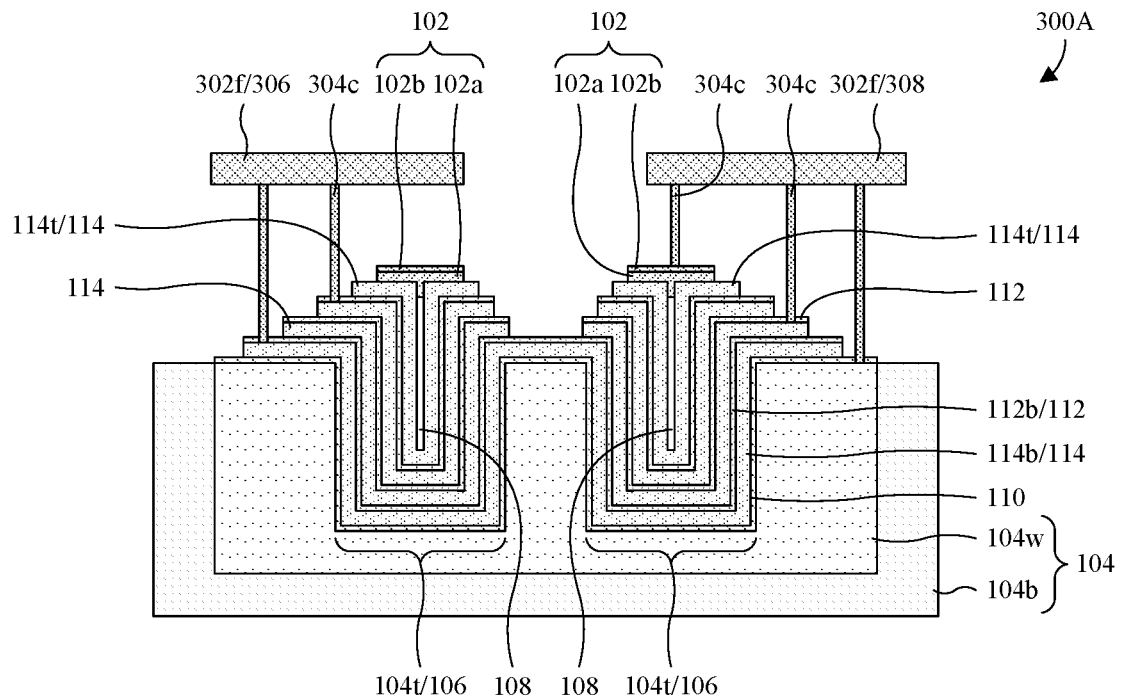
FIGS. 3A-3C illustrate cross-sectional views of various embodiments of a trench capacitor comprising multiple conductive cap structures individual to multiple trench segments.

With reference to FIG. 3A, a cross-sectional view 300A of some embodiments of a trench capacitor comprising multiple conductive cap structures 102 is provided. The conductive cap structures 102 are individual to and respectively overlie multiple trench segments 106. The trench segments 106 extend into the well region 104w of the substrate 104 and fill individual trenches 104t defined by the substrate 104. Further, the trench segments 106 define individual gaps 108 recessed into the substrate 104 and respectively sealed by the conductive cap structures 102. The conductive cap structures 102, the trenches 104t, the trench segments 106, and the gaps 108 may, for example, be as their counterparts are illustrated and/or described in anyone or combination of FIGS. 1 and 2A-2E.

The trench segments 106 are defined by the dielectric liner layer 110, the plurality of capacitor dielectric layers 112, and the plurality of in-trench capacitor electrodes 114. Note that only some of the capacitor dielectric layers 112 and only some of the in-trench capacitor electrodes 114 are labeled. The dielectric liner layer 110, a bottom capacitor dielectric layer 112b, and a bottom in-trench capacitor electrode 114b are shared by the trench segments 106. Further, a remainder of the in-trench capacitor electrodes 114 and a remainder of the capacitor dielectric layers 112 are individual to the trench segments 106. For example, top in-trench capacitor electrodes 114t are individual to the trench segments 106. The well region 104w is shared by the trench segments 106 and serves as an in-substrate capacitor electrode (e.g., a bottom or lower capacitor electrode). Further, the dielectric liner layer 110 serves as a capacitor dielectric layer.

A plurality of first-level wires 302f and a plurality of contact vias 304c are stacked over the trench segments 106. Note that only some of the contact vias 304c are labeled. The first-level wires 302f and the contact vias 304c may be or comprise, for example, copper, aluminum copper, aluminum, tungsten, some other suitable metal(s), some other suitable conductive material(s), or any combination of the foregoing. The first-level wires 302f comprise a first capacitor wire 306 and a second capacitor wire 308. The first capacitor wire 306 may, for example, serve as a first terminal of the trench capacitor and/or the second capacitor wire 308 may, for example, serve as a second terminal of the trench capacitor. Alternatively, overlying wires (not shown) may, for example, serve as the first and second terminals.

The first and second capacitor wires 306, 308 are electrically coupled to the in-trench capacitor electrodes 114 and the well region 104w by at least some of the contact vias 304c. For example, the second capacitor wire 308 is electrically coupled to an underlying one of the top in-trench capacitor electrodes 114t by one or more of the contact vias 304c. With exception of the top in-trench capacitor electrodes 114t, contact vias electrically couple directly with the in-trench capacitor electrodes 114. With the top in-trench capacitor electrodes 114t, contact vias electrically couple to the top in-trench capacitor electrodes 114t through the conductive cap structures 102. Because the conductive cap structures 102 are conductive, the conductive cap structures 102 do not act as electrical barriers. Hence, a junction between a conductive cap structure and a contact via has a low resistance, which improves the power efficiency of the electrical coupling and the reliability of the electrical coupling.

In some embodiments, in-trench capacitor electrodes that are not illustrated as being electrically coupled to the first and second capacitor wires 306, 308 are electrically coupled outside the cross-sectional view 300A to capacitor wires (e.g., the first and second capacitor wires 306, 308) electrically coupled to terminals of the trench capacitor. Further, in some embodiments, in-trench capacitor electrodes at each of the trench segments 106 are alternatingly electrically coupled to the first and second capacitor wires 306, 308, from a bottom of the trench capacitor to a top of the trench capacitor, by at least some of the contact vias 304c.

Figure 3B:
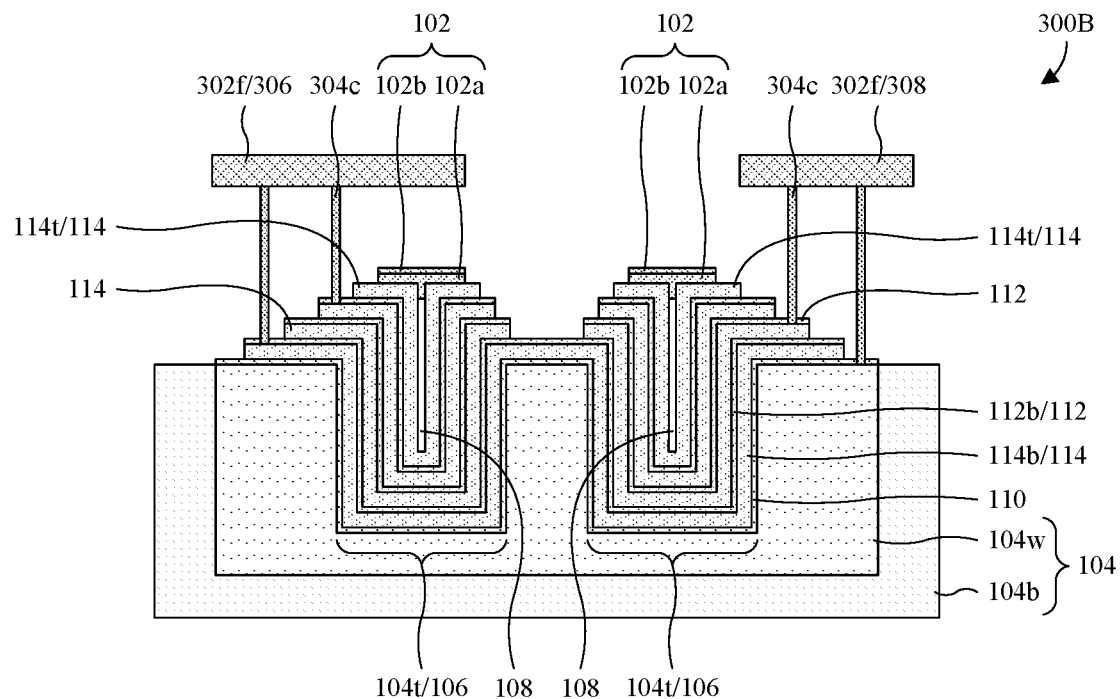

With reference to FIG. 3B, a cross-sectional view 300B of some alternative embodiments of the trench capacitor of FIG. 3A is provided in which no contact via extends from the second capacitor wire 308 to an underlying one of the conductive cap structures 102. In some embodiments, one or both of the conductive cap structures 102 and hence one or both of the top in-trench capacitor electrodes 114t are electrically floating.

Figure 3C:
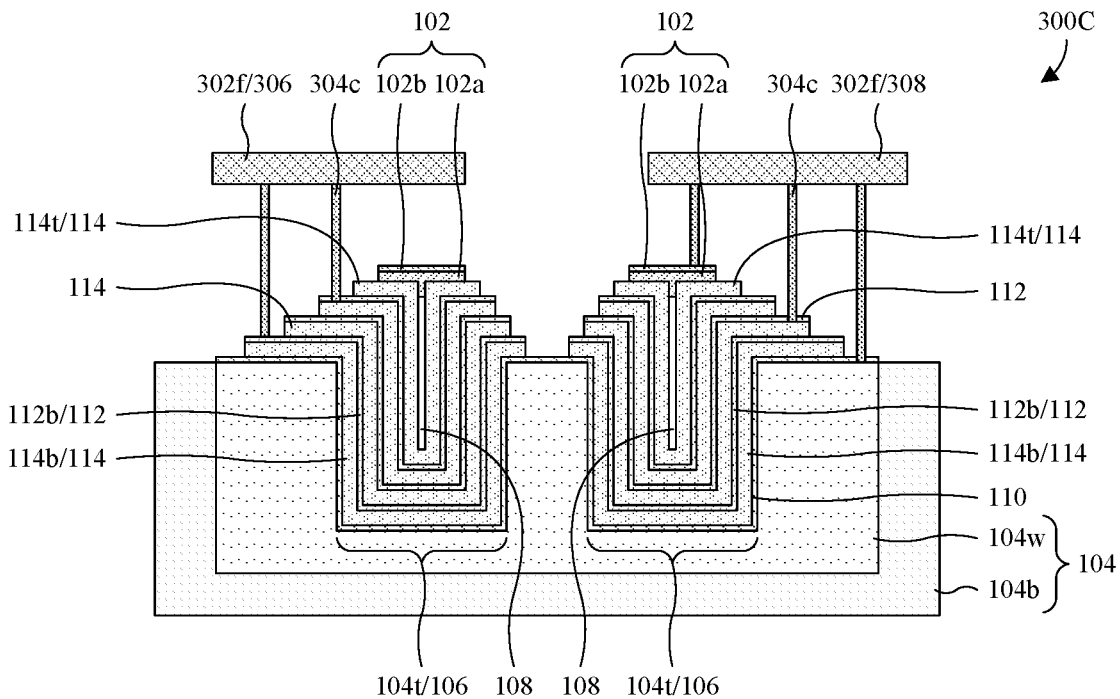

With reference to FIG. 3C, a cross-sectional view 300C of some alternative embodiments of the trench capacitor of FIG. 3A is provided in which the trench capacitor comprises multiple bottom in-trench capacitor electrodes 114b individual to the trench segments 106. Further, the trench capacitor comprises multiple bottom capacitor dielectric layers 112b individual to the trench segments 106. In alternative embodiments of the trench capacitor, the contact via extending from the second capacitor wire 308 to an underlying one of the conductive cap structures 102 is omitted as shown in FIG. 3B.

While FIGS. 3A and 3B illustrate a single in-trench capacitor electrode (i.e., the bottom in-trench capacitor electrode 114b) as being shared between the trench segments 106, one or more in-trench capacitor electrodes may be shared between the trench segments 106 in alternative embodiments. For example, the in-trench capacitor electrode immediately overlying the bottom in-trench capacitor electrode 114b may be shared. Further, while FIGS. 3A-3C illustrate the trench segments 106 configured according to embodiments in FIG. 2A, the trench segments 106 may alternatively be configured according to embodiments in any one or combination of FIGS. 1 and 2B-2E.

Figure 4A:
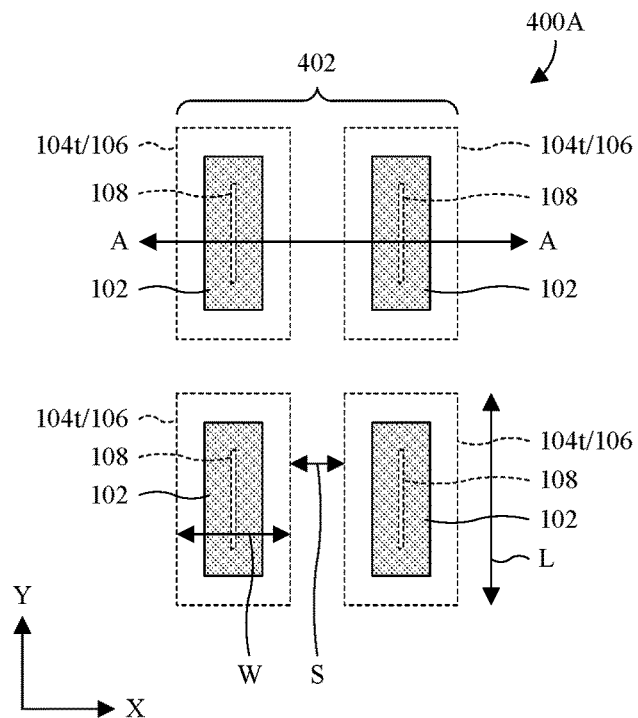
FIGS. 4A and 4B illustrate top layouts of various embodiments of the trench capacitor in any one of FIGS. 3A-3C.

With reference to FIG. 4A, a top layout 400A of some embodiments of the trench capacitor in any one of FIGS. 3A-C is provided in which the trench segments 106 are arranged in a two-dimensional (2D) trench array 402. The cross-sectional views 300A-300C of FIGS. 3A-3C may, for example, be taken along line A. The 2D trench array 402 comprises a plurality of rows and a plurality of columns. In some embodiments, the 2D trench array 402 comprises two columns (e.g., in an X dimension) and two rows (e.g., in a Y dimension). In alternative embodiments, the 2D trench array 402 has more or less rows and/or more or less columns.

In some embodiments, the 2D trench array 402 has mirror symmetry in both dimensions of the 2D trench array 402. For example, the 2D trench array 402 may be symmetric about a first axis equally bisecting the 2D trench array 402 in the X dimension and may further be symmetric about a second axis equally bisecting the 2D trench array 402 in the Y dimension. In some embodiments, the trench segments 106 share a common layout and/or share a common orientation. The common layout may, for example, be rectangular, square shaped, circular, oval shaped, or some other suitable shape. In some embodiments, a length L of the trench segments 106 is about 5-10 micrometers, about 5-7.5 micrometers, about 7.5-10 micrometers, or about 6.5 micrometers. In some embodiments, a spacing S between the trench segments 106 is about 0.10-0.20 micrometers, about 0.10-0.15 micrometers, about 0.15-0.20 micrometers, or about 0.13 micrometers. In some embodiments, a width W of the trench segments 106 is about 0.2-0.6 micrometers, about 0.2-0.4 micrometers, about 0.4-0.6 micrometers, about 0.4 micrometers, or about 0.3 micrometers. In some embodiments, the width W of the trench segments 106 is about 4-8 times, about 4-6 times, about 6-8 times, about 6 times, or about 8 times a total thickness of the conductive cap structures 102. The total thickness of the conductive cap structures 102 may, for example, correspond to the sum of the first and second thicknesses $Th_1$, $Th_2$ in FIG. 2A. Other values are, however, amenable for the length L, the spacing S, and the width W.

Figure 4B:
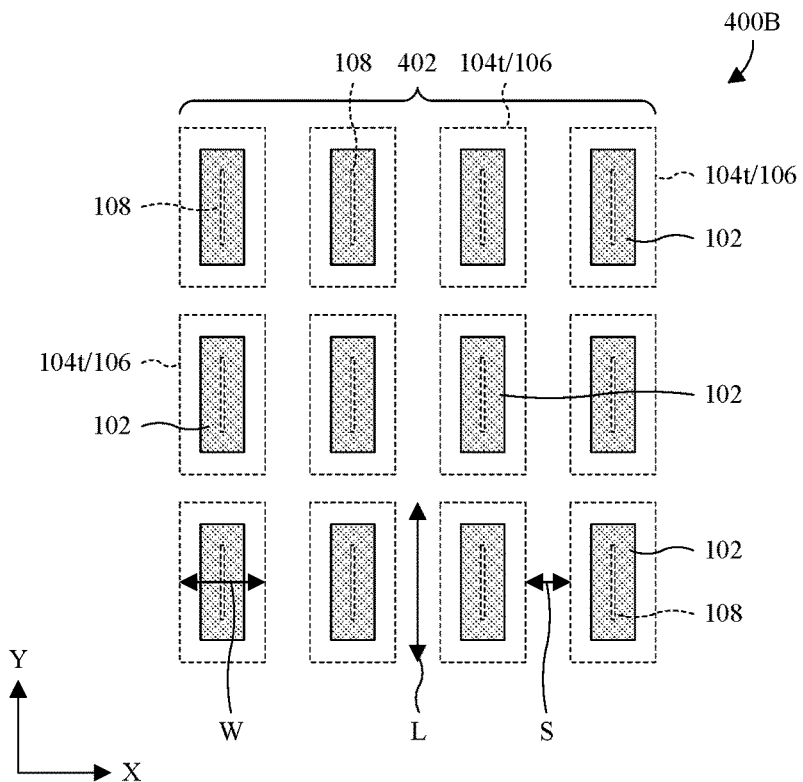

While FIG. 4A is illustrated with two rows and two columns, more or less columns and/or more or less rows are amenable. For example, with reference to FIG. 4B, a top layout 400B of some alternative embodiments of the trench capacitor of FIG. 4A is provided in which the 2D trench array 402 has three rows and four columns.

Figure 5:
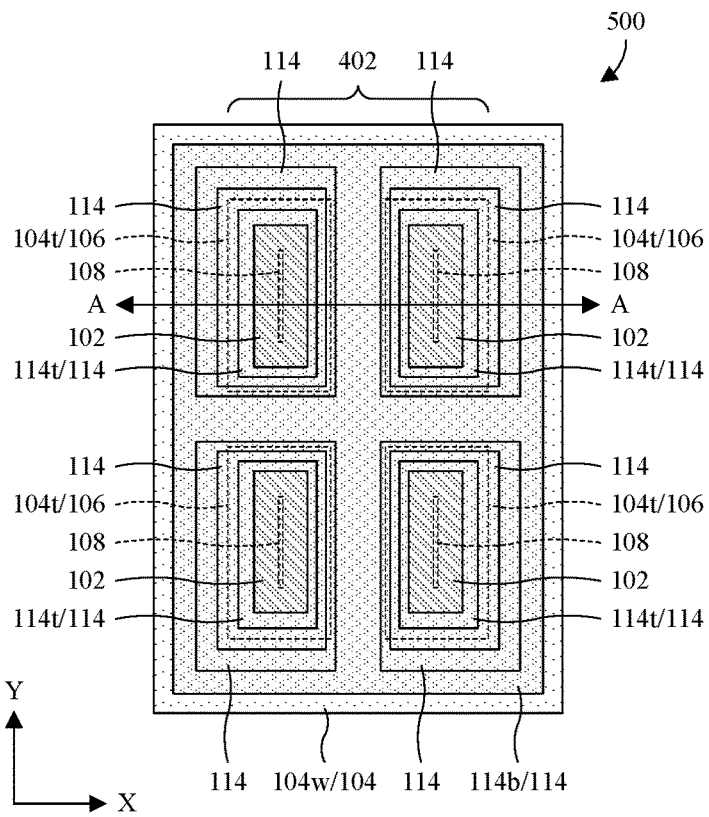
FIG. 5 illustrates a more detailed top layout of the trench capacitor of FIG. 4A in which in-trench capacitor electrodes are shown.

With reference to FIG. 5, a top layout 500 of some more detailed embodiments of the trench capacitor of FIG. 4A is provided in which in-trench capacitor electrodes 114 and a well region 104w are further shown. The trench segments 106 share a bottom in-trench capacitor electrode 114b and a well region 104w. Further, a remainder of the in-trench capacitor electrodes 114 are individual to the trench segments 106. For example, top in-trench capacitor electrodes 114t are individual to the trench segments 106.

Figure 6:
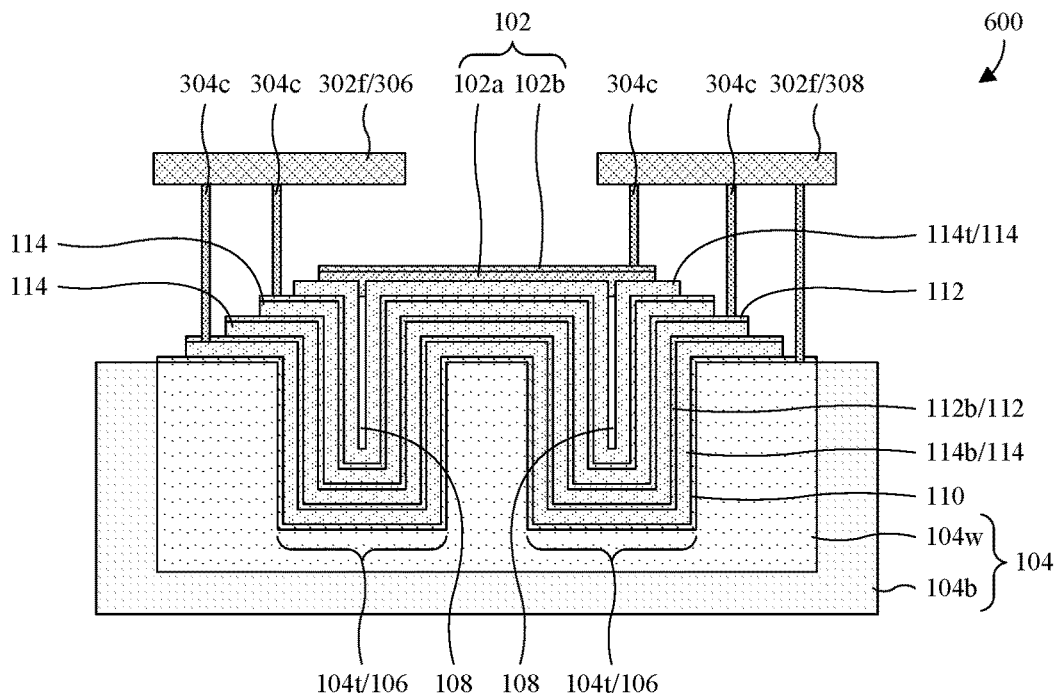
FIG. 6 illustrates a cross-sectional view of some embodiments of a trench capacitor comprising a single conductive cap structure shared by multiple trench segments.

With reference to FIG. 6, a cross-sectional view 600 of some alternative embodiments of the trench capacitor of FIG. 3A is provided in which the trench capacitor has a single conductive cap structure 102 shared amongst the trench segments 106. Further, the in-trench capacitor electrodes 114 are each shared amongst the trench segments 106. While FIG. 6 illustrates the second capacitor wire 308 as being electrically coupled to the conductive cap structure 102 by a corresponding one of the contact vias 304c, this contact via may be omitted in alternative embodiments. An example of this may, for example, be seen through comparison of FIG. 3A to FIG. 3B. Further, while FIG. 6 illustrates the trench segments 106 as being configured according to embodiments in FIG. 2A, the trench segments 106 may alternatively be configured according to embodiments in any one or combination of FIGS. 1 and 2B-2E.

Figure 7:
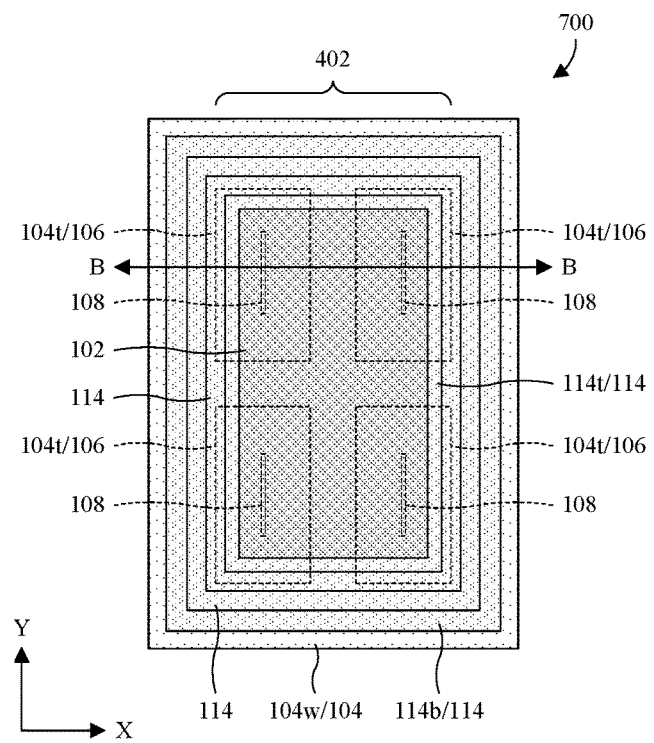
FIG. 7 illustrates a top layout of some embodiments of the trench capacitor of FIG. 6.

With reference to FIG. 7, a top layout 700 of some embodiments of the trench capacitor of FIG. 6 is provided in which the trench segments 106 are arranged in a 2D trench array 402. The cross-sectional view 600 of FIG. 6 may, for example, be taken along line B. The top layout 700 of FIG. 7 may, for example, be as the top layout 500 of FIG. 5 is illustrated and described, except that a single conductive cap structure 102 is shared amongst the trench segments 106 and the in-trench capacitor electrodes 114 are each shared amongst the trench segments 106. While FIG. 7 is illustrated with a 2D trench array that has four rows and four columns, more or less rows and/or more or less columns are amenable.

Figure 8A:
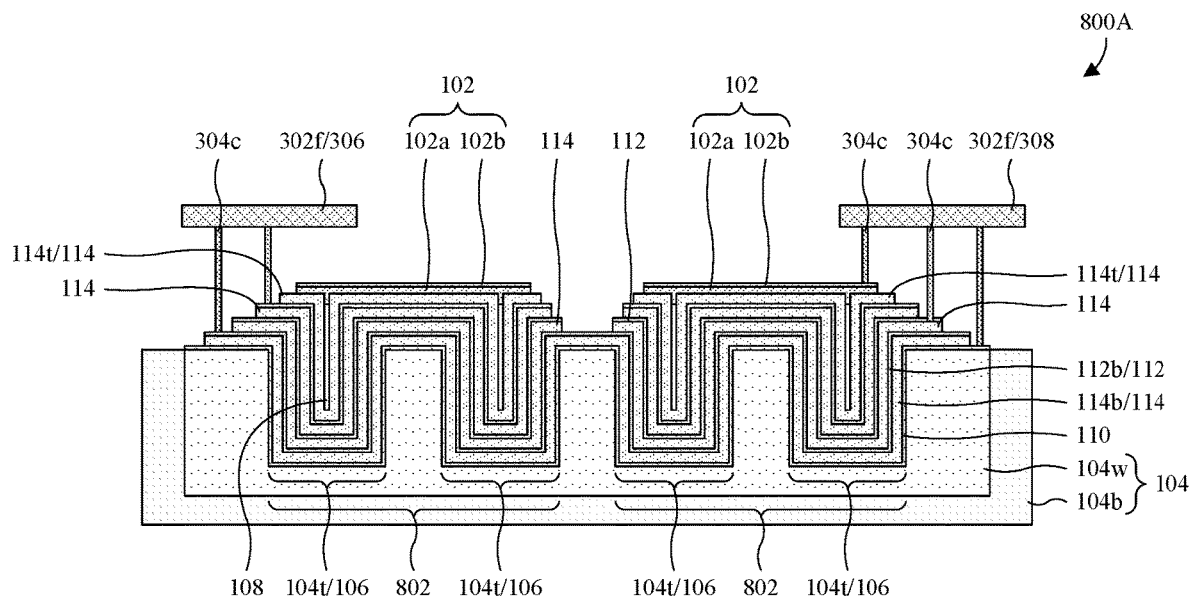
FIGS. 8A and 8B illustrate cross-sectional views of various embodiments of a trench capacitor comprising multiple conductive cap structures individual to multiple trench groups.

With reference to FIG. 8A, a cross-sectional view 800A of some embodiments of a trench capacitor is provided in which the trench capacitor comprises multiple conductive cap structures 102 individual to multiple groups 802 of trench segments 106 (hereafter trench groups 802). In some embodiments, as illustrated, the trench groups 802 have a common number of trench segments. For example, the trench groups 802 may each have two trench segments or some other suitable number of trench segments. In alternative embodiments, the trench groups 802 may have different numbers of trench segments.

The trench groups 802 are defined by the dielectric liner layer 110, the plurality of capacitor dielectric layers 112, and the plurality of in-trench capacitor electrodes 114. Note that only some of the capacitor dielectric layers 112 and only some of the in-trench capacitor electrodes 114 are labeled. The dielectric liner layer 110, a bottom capacitor dielectric layer 112b, and a bottom in-trench capacitor electrode 114b are shared by the trench groups 802. Further, a remainder of the in-trench capacitor electrodes 114 and a remainder of the capacitor dielectric layers 112 are individual to the trench groups 802. For example, top in-trench capacitor electrodes 114t are individual to the trench groups 802. The well region 104w is shared by the trench groups 802 and serves as an in-substrate capacitor electrode. Further, the dielectric liner layer 110 serves as a capacitor dielectric layer.

The first and second capacitor wires 306, 308 are electrically coupled to the in-trench capacitor electrodes 114 and the well region 104w by at least some of the contact vias 304c. Note that only some of the contact vias 304c are labeled. In some embodiments, in-trench capacitor electrodes that are not illustrated as being electrically coupled to the first and second capacitor wires 306, 308 are electrically coupled outside the cross-sectional view 800A to capacitor wires electrically coupled to terminals of the trench capacitor. Further, in some embodiments, in-trench capacitor electrodes at each of the trench groups 802 are alternatingly electrically coupled to the first and second capacitor wires 306, 308, from a bottom of the trench capacitor to a top of the trench capacitor, by at least some of the contact vias 304c.

Figure 8B:
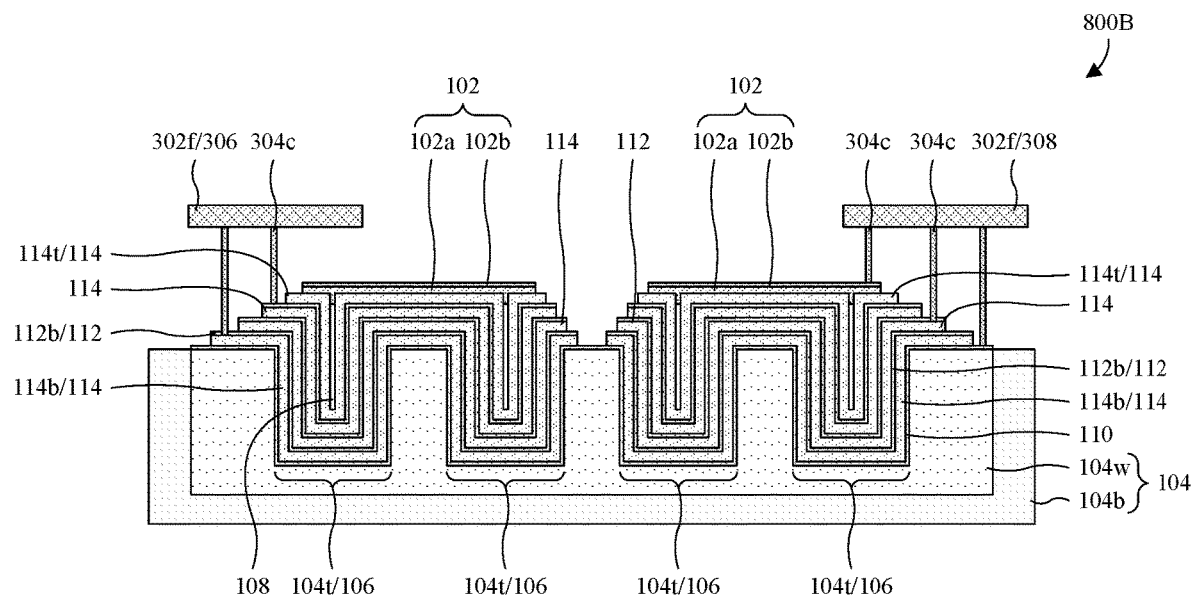

With reference to FIG. 8B, a cross-sectional view 800B of some alternative embodiments of the trench capacitor of FIG. 8A is provided in which the trench capacitor comprises multiple bottom in-trench capacitor electrodes 114b individual to the trench groups 802. Further, the trench capacitor comprises multiple bottom capacitor dielectric layers 112b individual to the trench groups 802.

While FIGS. 8A and 8B illustrate the second capacitor wire 308 as being electrically coupled to an underlying one of the conductive cap structure 102 by a corresponding one of the contact vias 304c, this contact via may be omitted in alternative embodiments. An example of this may, for example, be seen through comparison of FIG. 3A to FIG. 3B. Further, while FIGS. 8A and 8B illustrate the trench segments 106 as being configured according to embodiments in FIG. 2A, the trench segments 106 may alternatively be configured according to embodiments in any one or combination of FIGS. 1 and 2B-2E. Further yet, while FIG. 8A illustrates a single in-trench capacitor electrode (i.e., the bottom in-trench capacitor electrode 114b) as being shared between the trench groups 802, one or more in-trench capacitor electrodes may be shared between the trench groups 802 in alternative embodiments.

Figure 9A:
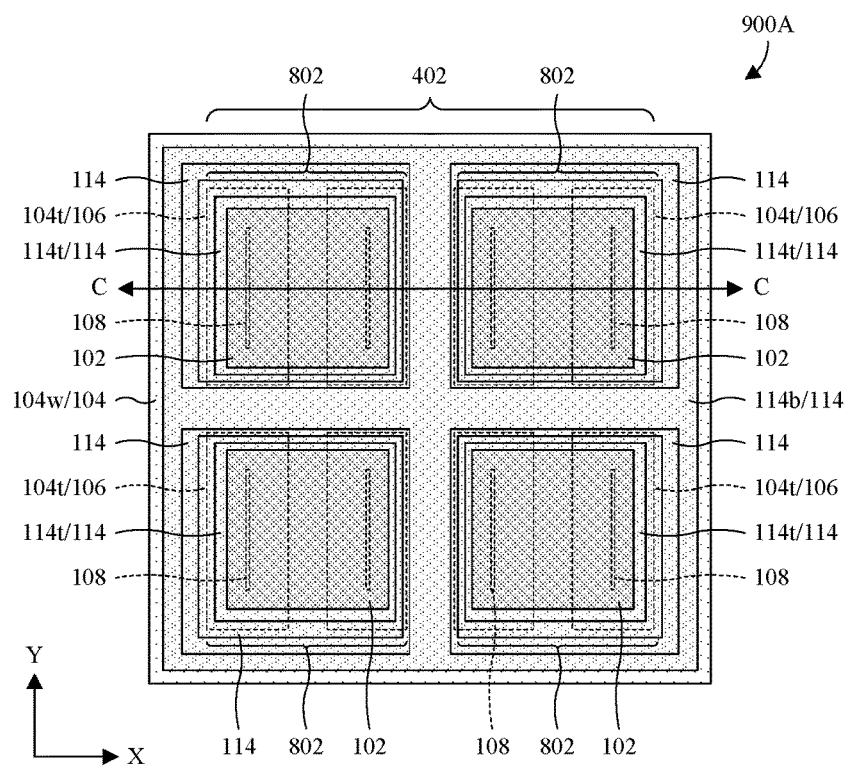
FIGS. 9A and 9B illustrate top layouts of various embodiments of the trench capacitor of FIG. 8A.

With reference to FIG. 9A, a top layout 900A of some embodiments of the trench capacitor in any one of FIGS. 8A and 8B is provided in which the trench segments 106 are arranged in a 2D trench array 402 and grouped into trench groups 802. The cross-sectional views 800A, 800B of FIGS. 8A and 8B may, for example, be taken along line C. The trench groups 802 correspond to quadrants of the 2D trench array 402 and each have the same number of trench segments. A bottom in-trench capacitor electrode 114b is shared by the trench groups 802, whereas a remainder of the in-trench capacitor electrodes 114 and the conductive cap structures 102 are individual to the trench groups 802.

Figure 9B:
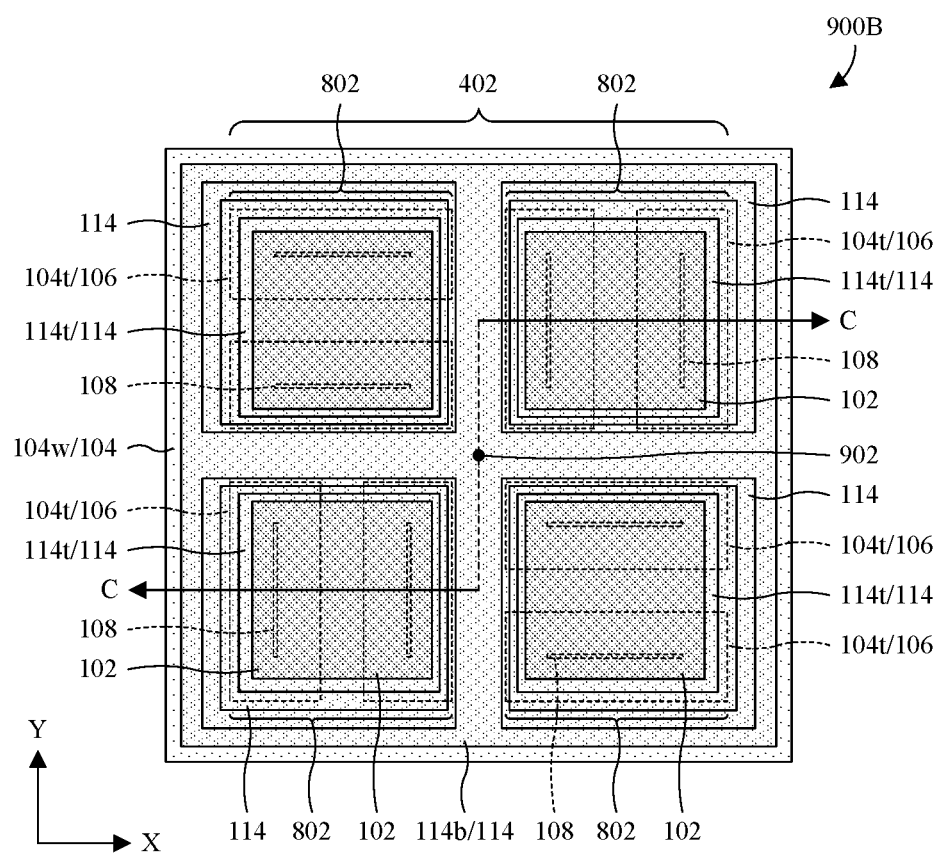

With reference to FIG. 9B, a top layout 900B of some alternative embodiments of trench capacitor of FIG. 9A is provided in which the 2D trench array 402 has rotational symmetry. The trench groups 802 are each rotated by about 90 degrees relative to an adjoining one of the trench groups 802 as one rotates about a center 902 of the 2D trench array 402. Further, the trench groups 802 have the same number of trench segments 106 and each border an outer edge of the 2D trench array 402. In some embodiments, the trench groups 802 share a first common layout and/or share a common size. Further, in some embodiments, the trench segments 106 share a second common layout and/or share a common orientation. The first common layout and/or the second common layout may, for example, each be rectangular, square shaped, circular, oval shaped, or some other shape.

The trench segments 106 may, for example, induce stress on the substrate 104 in directions perpendicular or transverse to respective lengths of the trench segments 106. Such stress may, for example, lead to warping, breaking, or cracking of the substrate 104 when the stress induced by the trench segments 106 is unbalanced. For example, the stress induced by the trench segments 106 may be unbalanced when all of the trench segments 106 have the same orientation. The rotational symmetry balances the stress induced by the trench segments 106 to reduce the likelihood of warping, breaking, or cracking of the substrate 104.

While FIGS. 9A and 9B are illustrated with a 2D trench array 402 that has four rows and four columns, more or less rows and/or more or less columns are amenable. Further, while FIG. 9B is illustrated with four trench groups 802, it is to be appreciated that more or less trench groups 802 are amenable. For example, the 2D trench array 402 may more generally be divided into N trench groups 802, where N is an integer greater than 1. Further, the trench groups 802 may each be rotated by about R degrees relative to an adjoining one of the trench groups 802 as one rotates about the center 902 of the 2D trench array 402, where R is the quotient of 360 divided by N.

Figure 10:
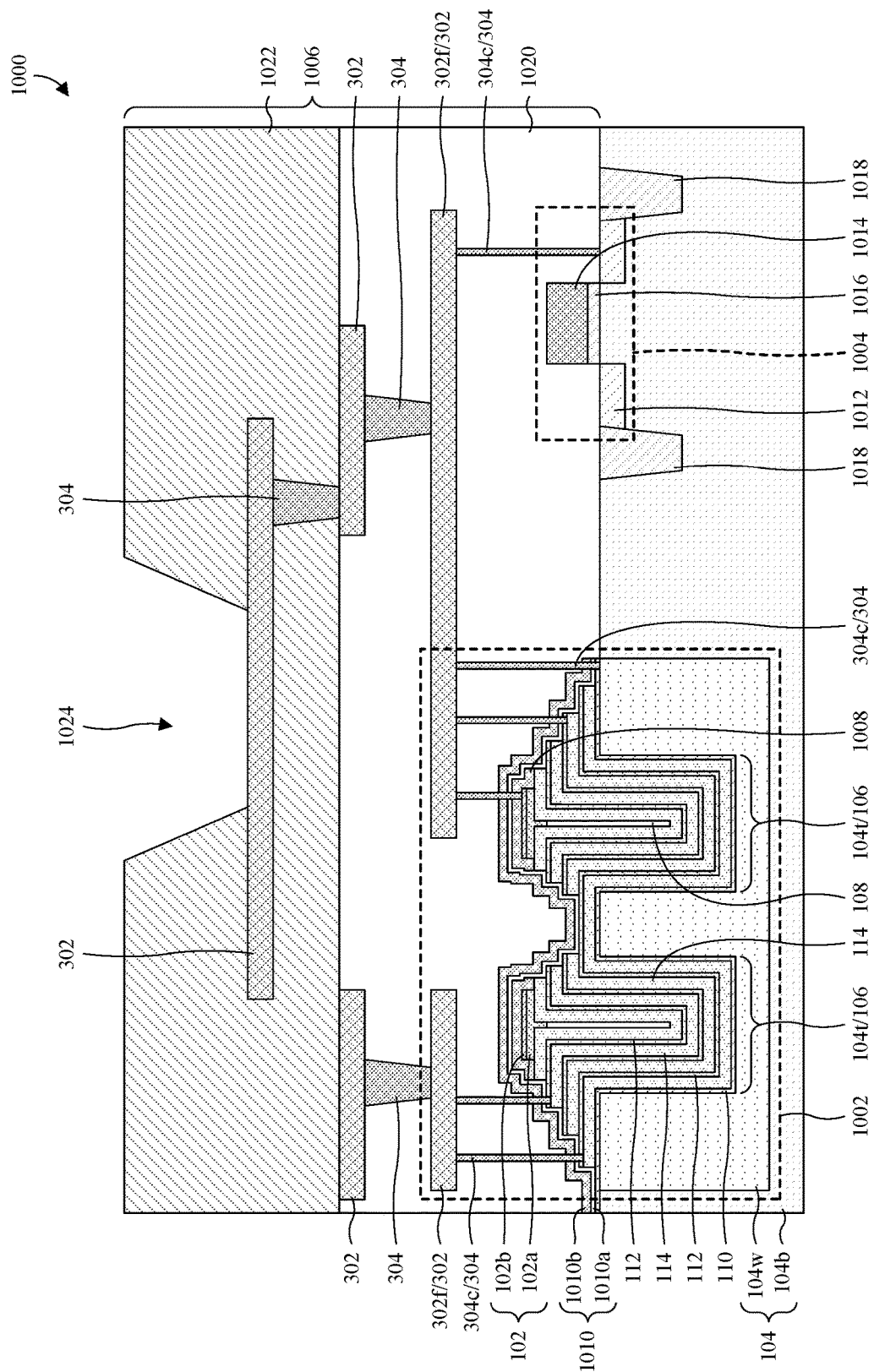
FIG. 10 illustrates a cross-sectional view of some embodiments of a trench capacitor electrically coupled to a transistor and comprising multiple conductive cap structures individual to multiple trench segments.

With reference to FIG. 10, a cross-sectional view of some embodiments of a trench capacitor 1002 electrically coupled to a transistor 1004 is provided. The trench capacitor 1002 and the transistor 1004 are on a substrate 104 and are covered by and electrically coupled to an interconnect structure 1006. The trench capacitor 1002 may, for example, be as illustrated and described with regard to FIG. 3A. The transistor 1004 may, for example, be a metal-oxide-semiconductor field-effect transistor (MOSFET) or some other suitable transistor.

The trench capacitor 1002 comprises multiple conductive cap structures 102 individual to and respectively overlying multiple trench segments 106. Further, the trench capacitor 1002 comprises multiple hard masks 1008 individual to and respectively overlying the conductive cap structures 102. Note that only one of the conductive cap structures 102 and only one of the hard masks 1008 are labeled. The hard masks 1008 may be or comprise, for example, silicon nitride, silicon oxide, a polymer, an anti-reflective coating (ARC), some other suitable hard mask material(s), or any combination of the foregoing. In some embodiments, an etch stop structure 1010 covers the trench segments 106 over the hard masks 1008. The etch stop structure 1010 may be comprise, for example, oxide, silicon nitride, some other suitable dielectric(s), or any combination of the foregoing. In some embodiments, the etch stop structure 1010 comprises a first etch stop layer 1010*a* and a second etch stop layer 1010*b* overlying the first etch stop layer 1010*a*. The first etch stop layer 1010*a* may be or comprise, for example, undoped silicate glass (USG) oxide and/or some other suitable dielectric(s), and/or the second etch stop layer 1010*b* may be or comprise, for example, silicon nitride and/or some other suitable dielectric(s).

The transistor 1004 comprises a pair of source/drain regions 1012 in the substrate 104, and further comprises a gate electrode 1014 and a gate dielectric layer 1016 stacked on the substrate 104 and between the source/drain regions 1012. Note that only one of the source/drain regions 1012 is labeled. The gate electrode 1014 may be or comprise, for example, doped polysilicon, metal, or some other suitable conductive material. The gate dielectric layer 1016 may be or comprise, for example, silicon oxide and/or some other suitable dielectric(s). In some embodiments, the transistor 1004 is surrounded by a trench isolation structure 1018. The trench isolation structure 1018 may be or comprise, for example, a shallow trench isolation (STI) structure or some other suitable trench isolation structure.

The interconnect structure 1006 comprises an interconnect dielectric layer 1020 and a passivation layer 1022 overlying the interconnect dielectric layer 1020. The interconnect dielectric layer 1020 may be or comprise, for example, silicon oxide, a low k dielectric, some other suitable dielectric(s), or any combination of the foregoing. The low k dielectric material may be, for example, a dielectric material with a dielectric constant k less than about 3.9, 2.0, or some other suitable value. The passivation layer 1022 may be or comprise, for example, silicon oxide, silicon nitride, some other suitable dielectric(s), or any combination of the foregoing. The interconnect structure 1006 further comprises a plurality of wires 302 and a plurality of vias 304.

The wires 302 and the vias 304 are stacked in the interconnect dielectric layer 1020 and the passivation layer 1022 to define conductive paths. For example, the wires 302 and the vias 304 define a conductive path between the trench capacitor 1002 and the transistor 1004. As another example, the wires 302 and the vias 304 define a conductive path from the trench capacitor 1002 to a topmost wire that is exposed by a pad opening 1024 in the passivation layer 1022. The wires 302 and the vias 304 may be or comprise, for example, copper, aluminum copper, tungsten, some other suitable metal(s), or any combination of the foregoing.

While FIG. 10 is illustrated using embodiments of the trench capacitor in FIG. 3A, embodiments of the trench capacitor in any one of FIGS. 1, 2A-2E, 3B, 3C, 4A, 4B, 5-7, 8A, 8B, 9A, and 9B may be used in alternative embodiments.

With reference to FIGS. 11-22, a series of cross-sectional views 1100-2200 of some embodiments of a method for forming a trench capacitor comprising a conductive cap structure is provided. The method is illustrated using embodiments of the trench capacitor in FIG. 3A but may also be used to form embodiments of the trench capacitor in any one of FIGS. 1, 2A-2E, 3B, 3C, 4A, 4B, 5-7, 8A, 8B, 9A, and 9B.

Figure 11:
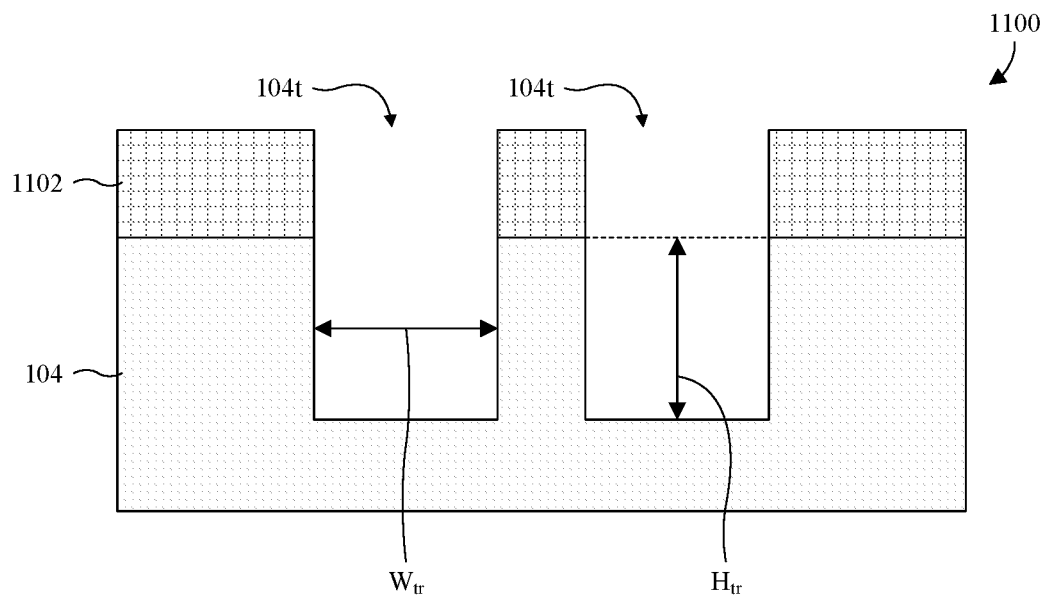
FIGS. 11-22 illustrate a series of cross-sectional views of some embodiments of a method for forming a trench capacitor comprising a conductive cap structure.

As illustrated by the cross-sectional view 1100 of FIG. 11, a substrate 104 is patterned to form a plurality of trenches 104*t*. In some embodiments, the trenches 104*t* are arranged in an array when viewed top down (not visible in the cross-sectional view 1100 of FIG. 11). The array may, for example, have the same layout as the 2D trench array 402 in any one or combination of FIGS. 4A, 4B, 5, 7, 9A, and 9B. In some embodiments, the trenches 104*t* each have a high aspect ration (i.e., a high ratio of height $H_{tr}$ to width $W_{tr}$). The high aspect ratio may, for example, be greater than about 25:1, about 30:1, about 20:1 to 40:1, or some other suitable value. The substrate 104 may, for example, be p-type or n-type and/or may be, for example, a bulk silicon substrate, a SOI substrate, or some other suitable semiconductor substrate.

In some embodiments, a process for patterning the substrate 104 comprises forming a mask 1102 over the substrate 104 and with a layout of the trenches 104*t*, and subsequently performing an etch into the substrate 104 with the mask 1102 in place. Other processes are, however, amenable. In some embodiments, the process for patterning the substrate 104 further comprises removing the mask 1102 after the etch. The mask 1102 may be or comprise, for example, photoresist, silicon oxide, silicon nitride, some other mask material, or any combination of the foregoing. In some embodiments in which the mask 1102 is a hard mask material, the forming of the mask 1102 comprises: 1) depositing a hard mask layer on the substrate 104; 2) forming a photoresist mask over the hard mask layer using photolithography; 3) performing an etch into the hard mask layer with the photoresist mask in place; and 4) removing the photoresist mask after the etch. Other processes are, however, amenable.

Figure 12:
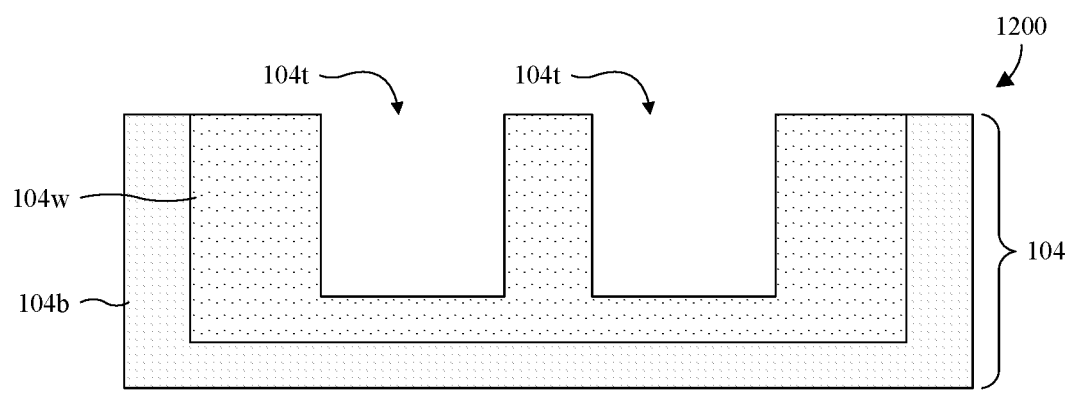

As illustrated by the cross-sectional view 1200 of FIG. 12, the substrate 104 is doped to form a well region 104*w* lining the trenches 104*t*. The well region 104*w* overlies a bulk region 104*b* of the substrate 104 and has a different doping type and/or concentration than the bulk region 104*b*. The well region 104*w* may, for example, be formed by ion implantation or some other suitable doping process. In some alternative embodiments of the method being described by FIGS. 11-22, the well region 104*w* is formed before the patterning at FIG. 11 or is not formed.

Figure 13:
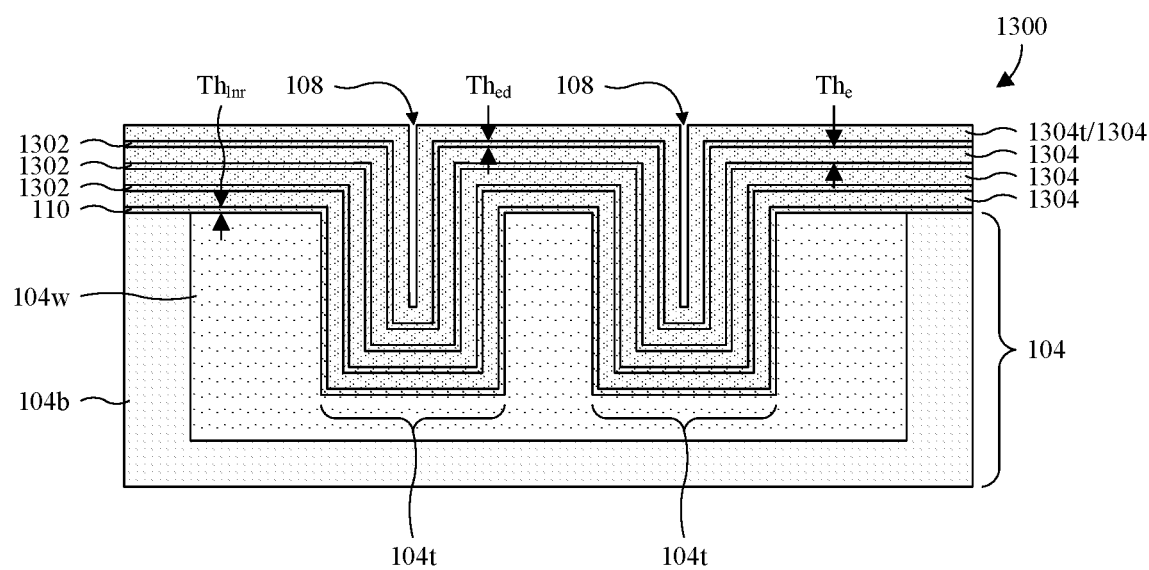

As illustrated by the cross-sectional view 1300 of FIG. 13, a dielectric liner layer 110 is deposited covering the substrate 104 and lining the trenches 104*t*. In some embodiments, the dielectric liner layer 110 is or comprises silicon oxide, a high k dielectric, some other suitable dielectric(s), or any combination of the foregoing. In some embodiments, the dielectric liner layer 110 has a thickness $Th_{lnr}$ between about 30-90 angstroms, about 30-50 angstroms, about 50-70 angstroms, or about 70-90 angstroms. Other values are, however, amenable. The dielectric liner layer 110 may, for example, be formed by vapor deposition, thermal oxidation, some other suitable deposition process(es), or any combination of the foregoing.

Also illustrated by the cross-sectional view 1300 of FIG. 13, a plurality of electrode dielectric layers 1302 and a plurality of electrode layers 1304 are formed alternatingly stacked over and lining the trenches 104*t*. Further, a top electrode layer 1304*t* of the plurality of electrode layers 1304 defines multiple gaps 108 individual to and respectively at the trenches 104*t*. The gaps 108 may, for example, also be known as voids, cavities, or some other suitable name. The electrode dielectric layers 1302 and the electrode layers 1304 may, for example, be formed by vapor deposition and/or some other suitable deposition process(es).

In some embodiments, the electrode dielectric layers 1302 are or comprise silicon oxide, a high k dielectric, some other suitable dielectric(s), or any combination of the foregoing. The high k dielectric may be or comprise, for example, hafnium oxide (e.g., HfO2), zirconium oxide (e.g., ZrO2), aluminum oxide (e.g., Al2O3), tantalum oxide (e.g., Ta2O5), titanium oxide (e.g., TiO2), some other suitable high κ dielectric(s), or any combination of the foregoing. In some embodiments, the electrode dielectric layers 1302 are each a ZAZ multilayer film comprising a pair of zirconium oxide layers and an aluminum oxide layer sandwiched between and contacting the zirconium oxide layers. In some embodiments, the electrode dielectric layers 1302 have a thickness $Th_{ed}$ between about 30-90 angstroms, about 30-50 angstroms, about 50-70 angstroms, or about 70-90 angstroms. Other values are, however, amenable.

In some embodiments, the electrode layers 1304 are or comprise titanium nitride, tantalum nitride, aluminum copper, some other suitable conductive material(s) and/or metal(s), or any combination of the foregoing. In some embodiments, the electrode layers 1304 are each a multi-layer film comprising an aluminum copper layer and a tantalum nitride layer overlying or underlying the aluminum copper layer. In some embodiments, the electrode layers 1304 have a thickness $Th_{e8}$ between about 250-400 angstroms, about 200-500 angstroms, about 200-350 angstroms, or about 350-500 angstroms. Other values are, however, amenable.

Figure 14:
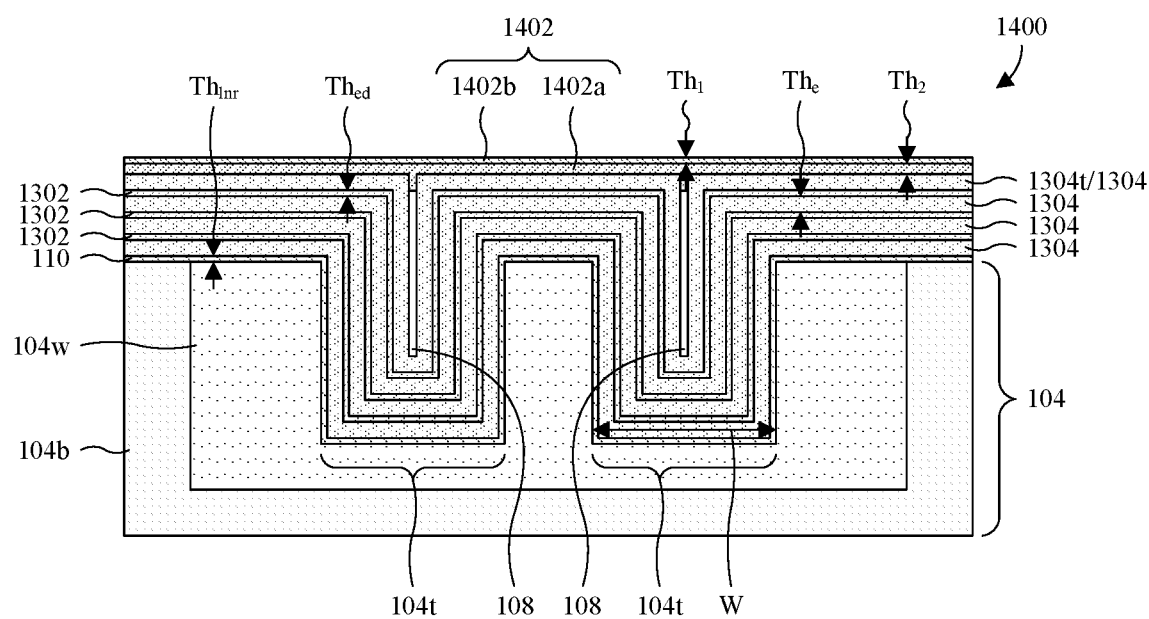

As illustrated by the cross-sectional view 1400 of FIG. 14, a conductive cap layer 1402 is formed covering the top electrode layer 1304*t* and sealing the gaps 108 without fully filling the gaps 108. In some embodiments, the gaps 108 are vacuum sealed and/or hermetically sealed by the conductive cap layer 1402. In some embodiments, the gaps 108 are filled with a gas comprising air, oxygen, nitrogen, argon, carbon dioxide, some other suitable gas(es), or any combination of the foregoing. The conductive cap layer 1402 comprises a lower conductive layer 1402*a* and further comprises an upper conductive layer 1402*b* overlying the lower conductive layer. The upper conductive layer 1402*b* may, for example, serve as an oxygen barrier to prevent oxygen from reaching and oxidizing the lower conductive layer 1402*a*. The lower conductive layer 1402*a* may, for example, be pure/elemental titanium or some other suitable conductive material. The upper conductive layer 1402*b* may, for example, be or comprise titanium nitride, tantalum nitride, some other suitable conductive material(s), some other suitable conductive oxygen barrier material(s), or any combination of the foregoing. In some embodiments, the upper conductive layer 1402*b* is or comprises the same material as the electrode layers 1304. In some embodiments, the upper conductive layer 1402*b* is or comprises a metal nitride, whereas the lower conductive layer 1402*a* is or comprises a metal.

In some embodiments, the lower conductive layer 1402*a* has a first thickness $Th_1$ that is about 400 angstroms, between about 350-450 angstroms, between about 350-400 angstroms, or between about 400-450 angstroms. Other values are, however, amenable. If the first thickness $Th_1$ is too small (e.g., less than about 350 angstroms or some other suitable value(s)), the lower conductive layer 1402*a* may be unable to hermetically seal the gaps 108 and/or may be prone to collapse into the gaps 108. If the first thickness $Th_1$ is too large (e.g., more than about 450 angstroms or some other suitable value(s)), material may be wasted. In some embodiments, the upper conductive layer 1402*b* has a second thickness $Th_2$ that is about 100 angstroms, between about 50-150 angstroms, between about 50-100 angstroms, or between about 100-150 angstroms. Other values are, however, amenable. If the second thickness $Th_2$ is too small (e.g., less than about 50 angstroms or some other suitable value(s)), the upper conductive layer 1402*b* may be unable to protect the lower conductive layer 1402*a* from oxidation. For example, oxygen may pass through the upper conductive layer 1402*b* to the lower conductive layer 1402*a*. If the second thickness $Th_2$ is too large (e.g., more than about 150 angstroms or some other suitable value(s)), material may be wasted.

In some embodiments, the first and second thicknesses $Th_1$, $Th_2$ are chosen so a width W of the trenches 104*t* is about 4-8, about 4-6, about 6-8, about 6, or about 8 times a total thickness (i.e., the sum of the first and second thicknesses $Th_1$, $Th_2$) of the conductive cap layer 1402. Such embodiments may, for example, arise when: 1) the trench segments are filled with four electrode layers 1304; 2) the electrode layers 1304 have a thickness $Th_e$ between about 250-400 angstroms; 3) the dielectric layers have a thickness $Th_{ed}$ between about 50-70 angstroms; and 4) the dielectric liner layer 110 has a thickness $Th_{lnr}$ between about 50-70 angstroms. If the total thickness of the conductive cap layer 1402 is too thin (e.g., less than about ⅛ of the width W or some other suitable fraction of the width W), the gaps 108 may be too large and the conductive cap layer 1402 may collapse into the gaps 108. If the total thickness of the conductive cap layer 1402 is too large (e.g., greater than about ¼ of the width W or some other suitable fraction of the width W), material may be wasted. Notwithstanding the multiples and thicknesses above, other thicknesses and multiples are amenable.

In some embodiments, a process for forming the conductive cap layer 1402 comprises: 1) depositing the lower conductive layer 1402*a* by PVD; and 2) subsequently depositing the upper conductive layer 1402*b* by MOCVD. Other processes for forming the conductive cap layer 1402 are, however, amenable. The lower conductive layer 1402*a* seals the gaps 108 and, since PVD does not depend upon precursors, no precursors become trapped in the gaps 108. Because there are no precursors trapped in the gaps 108, outgassing from the gaps 108 is reduced. This, in turn, reduces the risk of cracking and/or delamination for layers already formed on the substrate 104 (e.g., the dielectric liner layer 110) and for layers subsequently formed on the substrate 104 (e.g., an IMD layer).

Further, in at least embodiments in which the lower conductive layer 1402*a* is or comprises pure/elemental titanium deposited by PVD and the upper conductive layer 1402*b* is or comprises titanium nitride deposited by MOCVD, the "substrate" effect is ameliorated. The substrate effect refers to deposition at different rates for different substrates. With different deposition rates, a layer is formed thicker than it would otherwise be to compensate for the worst-case scenario, whereby material and money are wasted. The upper conductive layer 1402*b* would suffer from the substrate effect if formed directly on the top electrode layer 1304*t*. However, because the lower conductive layer 1402*a* is first formed, the upper conductive cap layer 1402*b* does not suffer from the substrate effect. Rather, the lower conductive layer 1402*a* serves as a wetting layer for the upper conductive layer 1402*b* so the upper conductive layer 1402*b* does not suffer from the substrate effect. Further, the lower conductive layer 1402*a* does not suffer from the substrate effect since its formed by PVD.

Figure 15:
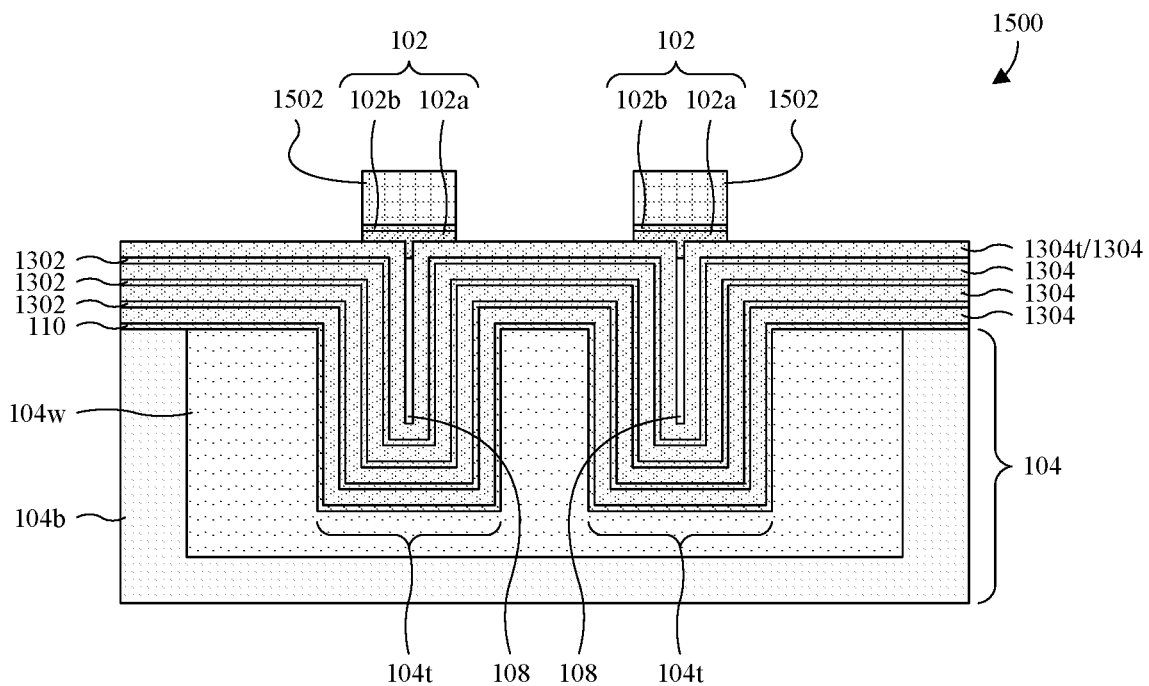

As illustrated by the cross-sectional view 1500 of FIG. 15, the conductive cap layer 1402 (see FIG. 14) is patterned to form a plurality of conductive cap structures 102. The conductive cap structures 102 respectively overlie and seal the gaps 108 and comprise individual lower conductive cap layers 102*a* and individual upper conductive layers 102*b*. The conductive cap structures 102 may, for example, have a top layout as shown in FIG. 4A and/or FIG. 5. In some embodiments, a process for patterning the conductive cap layer 1402 comprises: 1) forming a mask 1502 over the conductive cap layer 1402 and with a layout of the conductive cap structures 102; and 2) performing an etch into the conductive cap layer 1402 with the mask 1502 in place. Other processes are, however, amenable. In some embodiments, the process for patterning the conductive cap layer 1402 further comprises removing the mask 1502 after the etch. The mask 1502 may be or comprise, for example, photoresist, silicon oxide, silicon nitride, some other mask material, or any combination of the foregoing.

By sealing the gaps 108 without filling the gaps 108, the gaps 108 may deform to absorb stress on the substrate 104. As such, warpage of the substrate 104 and/or cracking of layers on the substrate 104 may be reduced. Further, by sealing the gaps 108, photoresist is prevented from building up in the gaps 108. Photoresist is difficult to remove from the gaps 108. Further, photoresist in the gaps 108 prevents the gaps 108 from deforming to absorb stress on the substrate 104 and/or may imposes stress on the substrate 104 due to, for example, a high coefficient of thermal expansion. Hence, by preventing photoresist from building up in the gaps 108, stress on the substrate 104 may be reduced.

Figure 16:
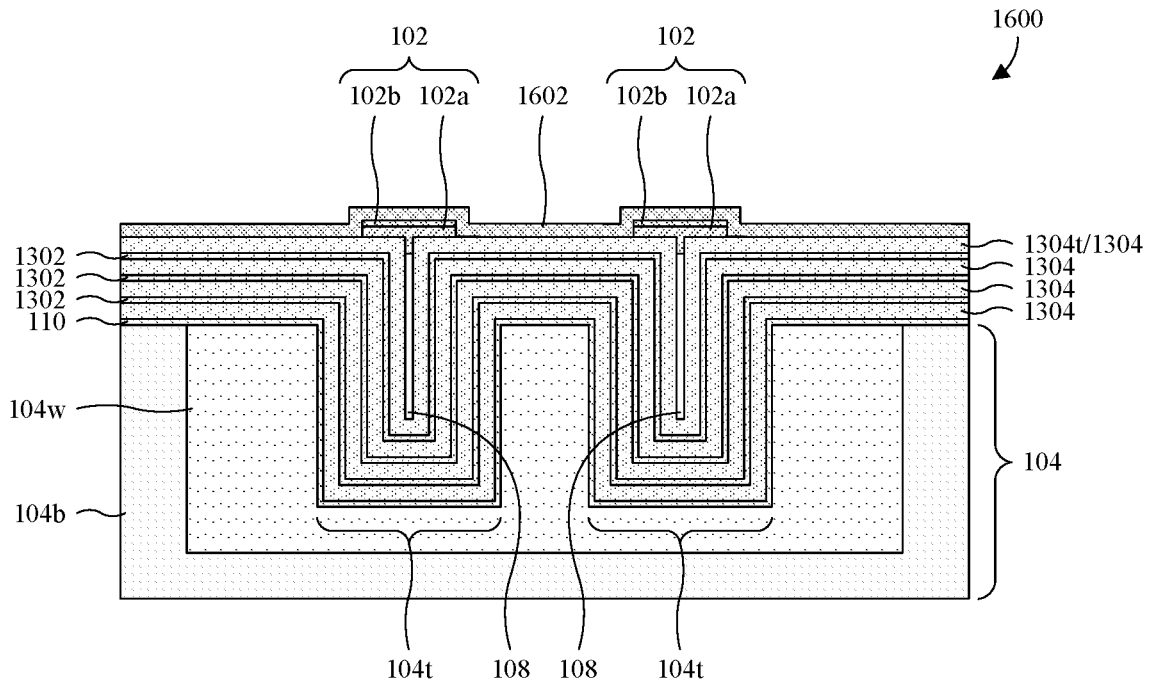

As illustrated by the cross-sectional view 1600 of FIG. 16, a hard mask layer 1602 is formed over the top electrode layer 1304*t* and the conductive cap structures 102. The hard mask layer 1602 may be or comprise, for example, silicon nitride, silicon oxide, silicon carbide, ARC, some other suitable hard mask material(s), or any combination of the foregoing. The hard mask layer 1602 may, for example, be formed by vapor deposition, spin on coating, or some other suitable deposition process. In some embodiments, the hard mask layer 1602 is or comprises a bottom ARC (BARC) and/or is deposited by spin on coating.

Figure 17:
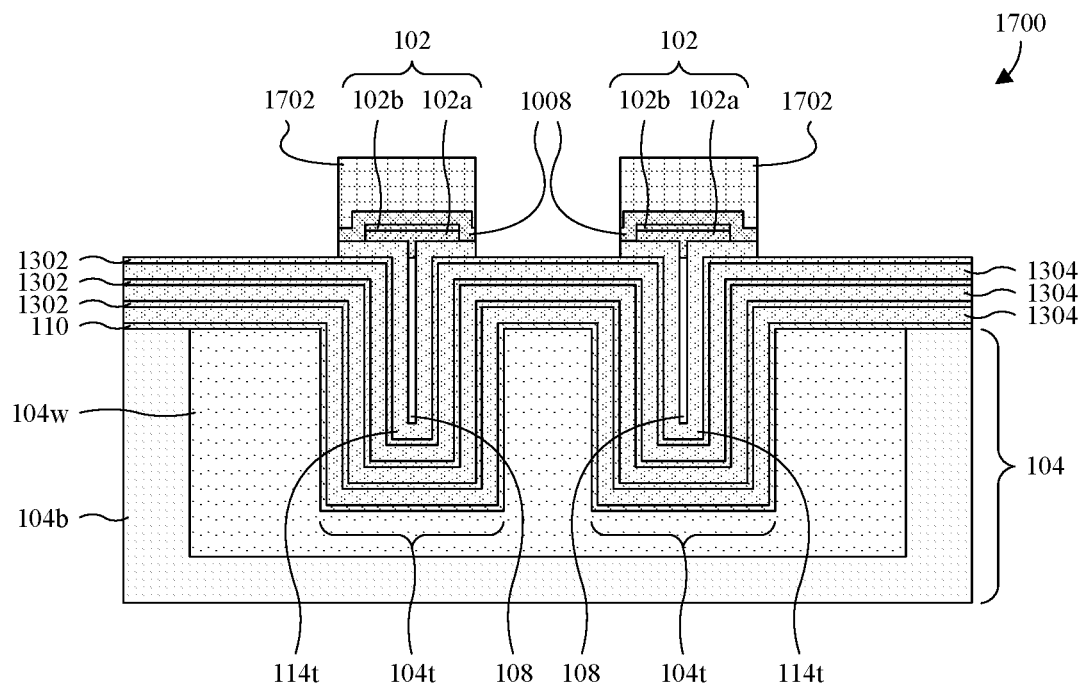

As illustrated by the cross-sectional view 1700 of FIG. 17, the hard mask layer 1602 (see FIG. 16) and the top electrode layer 1304*t* (see FIG. 16) are patterned. The patterning forms a plurality of hard masks 1008 and a plurality of top in-trench capacitor electrodes 114*t*. The hard masks 1008 are individual to and respectively overlie the conductive cap structures 102, and the top in-trench capacitor electrodes 114*t* are individual and respectively underlie the conductive cap structures 102.

In some embodiments, a process for patterning the hard mask layer 1602 and the top electrode layer 1304*t* comprises: 1) forming a photoresist mask 1702 over the hard mask layer 1602 and with a top-electrode pattern using photolithography; 2) performing an etch into the hard mask layer 1602 and the top electrode layer 1304*t* with the photoresist mask 1702 in place; and 3) removing the photoresist mask 1702. In alternative embodiments, the process for patterning the hard mask layer 1602 and the top electrode layer 1304*t* comprises: 1) forming the photoresist mask 1702 over the hard mask layer 1602 and with the top-electrode pattern using photolithography; 2) performing a first etch into the hard mask layer 1602 with the photoresist mask 1702 in place; 3) removing the photoresist mask 1702; and 4) performing a second etch into the top electrode layer 1304*t* after the removing. Other processes are, however, amenable.

Figure 18:
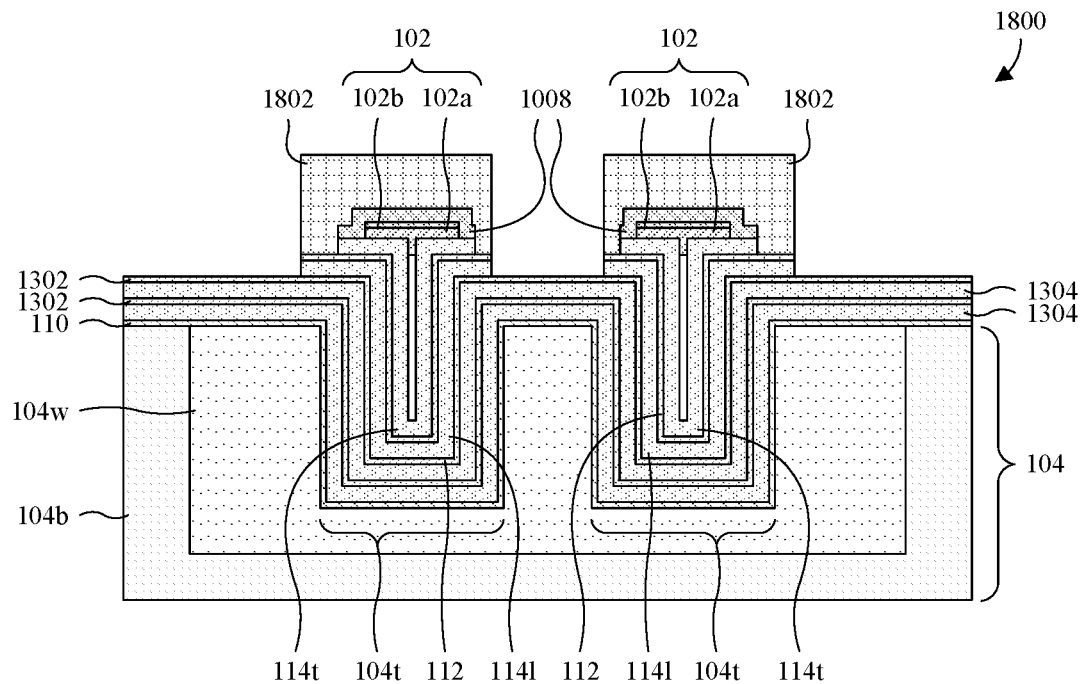
Figure 19:
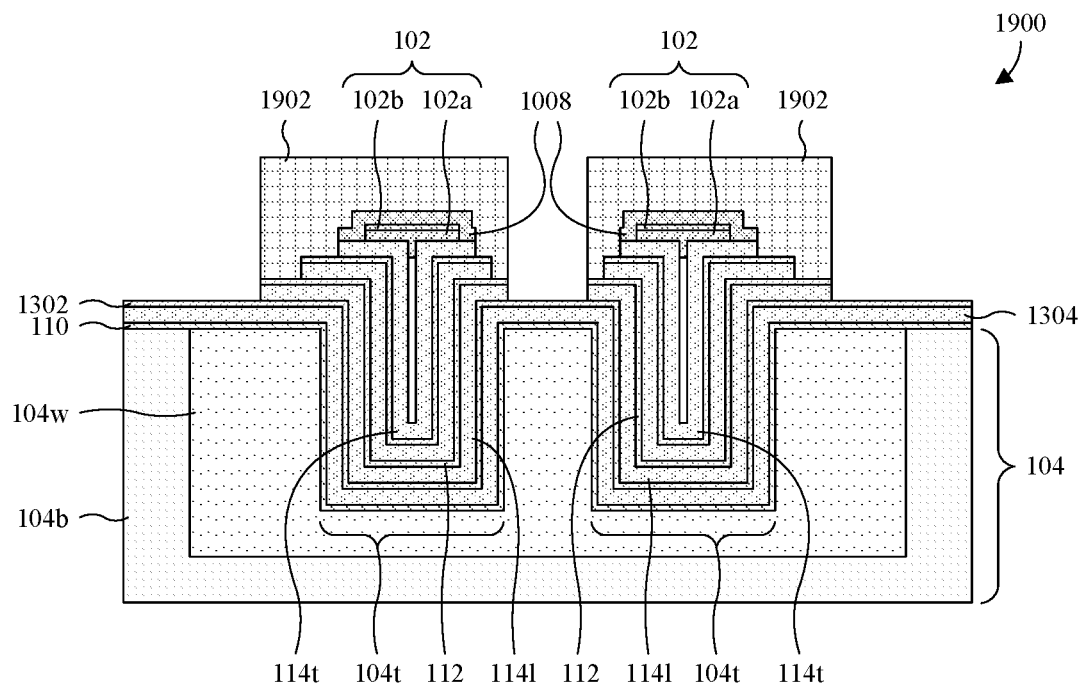
Figure 20:
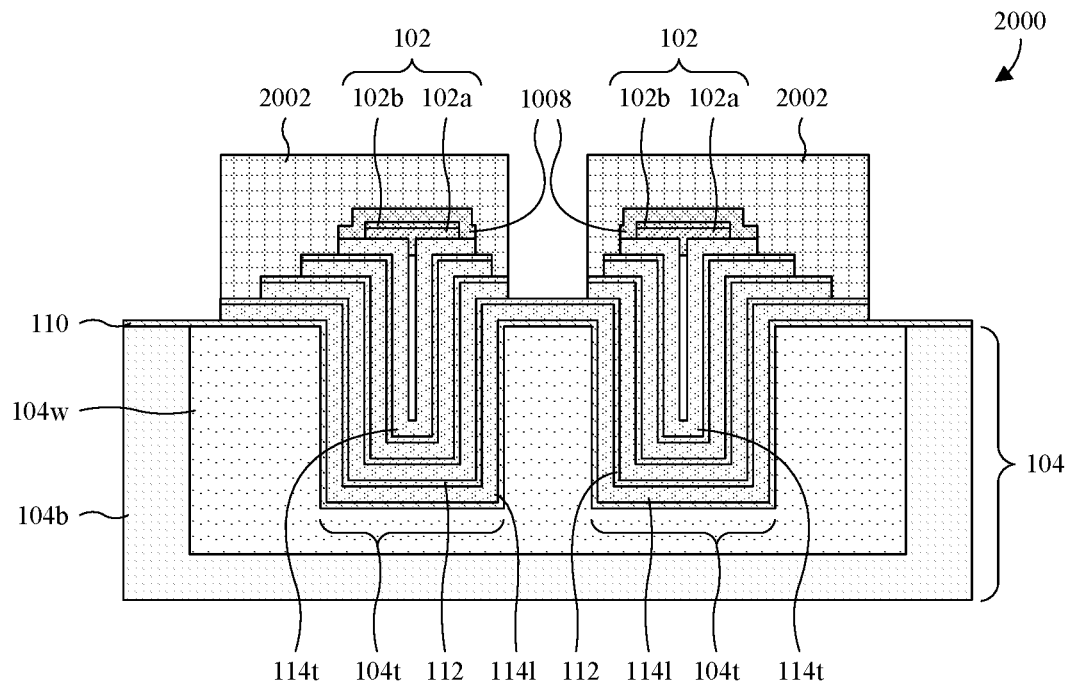

As illustrated by the cross-sectional views 1800-2000 of FIGS. 18-20, the electrode dielectric layers 1302 (see FIG. 17) and a remainder of the electrode layers 1304 (see FIG. 17) are sequentially patterned from the top in-trench capacitor electrodes 114*t* to the dielectric liner layer 110. In some embodiments, each remaining electrode layer and an immediately overlying electrode dielectric layer are patterned together. The patterning forms lower in-trench capacitor electrodes 114*l* and capacitor dielectric layers 112 alternatingly stacked between the top in-trench capacitor electrodes 114*t* and the dielectric liner layer 110.

In some embodiments, the patterning of a remaining electrode layer and an immediately overlying electrode dielectric layer comprises: 1) forming a photoresist mask over the electrode dielectric layer and with an electrode pattern using photolithography; 2) performing an etch into the electrode dielectric layer and the electrode layer with the photoresist mask in place; and 3) removing the photoresist mask. Other processes are, however, amenable. Examples of the photoresist mask include a first photoresist mask 1802 at FIG. 18, a second photoresist mask 1902 at FIG. 19, and a third photoresist mask 2002 at FIG. 20.

Figure 21:
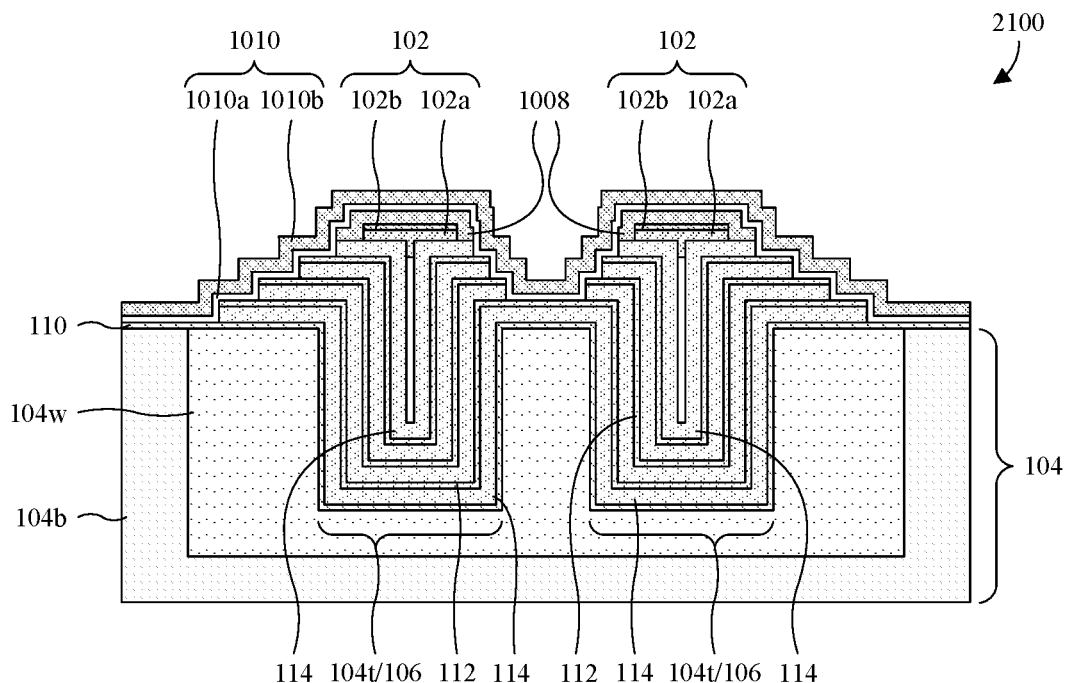

As illustrated by the cross-sectional view 2100 of FIG. 21, after completing the patterning of FIGS. 18-20, a plurality of capacitor dielectric layers 112 and a plurality of in-trench capacitor electrodes 114 remain stacked over the substrate 104. The capacitor dielectric layers 112 and the in-trench capacitor electrodes 114 are alternatingly stacked and define trench segments 106 respectively filling the trenches 104*t*. Note that only some of the in-trench capacitor electrodes 114 and some of the capacitor dielectric layers 112 are labeled.

Also illustrated by the cross-sectional view 2100 of FIG. 21, an etch stop structure 1010 is formed over the trench segments 106. The etch stop structure 1010 may be comprise, for example, oxide, silicon nitride, some other suitable dielectric(s), or any combination of the foregoing. Further, the etch stop structure 1010 may, for example, be formed by vapor deposition and/or some other suitable deposition process(es). In some embodiments, the etch stop structure 1010 comprises a first etch stop layer 1010*a* and a second etch stop layer 1010*b* overlying the first etch stop layer 1010*a*. The first etch stop layer 1010*a* may be or comprise, for example, USG oxide and/or some other suitable dielectric(s). The second etch stop layer 1010*b* may be or comprise, for example, silicon nitride and/or some other suitable dielectric(s).

Figure 22:
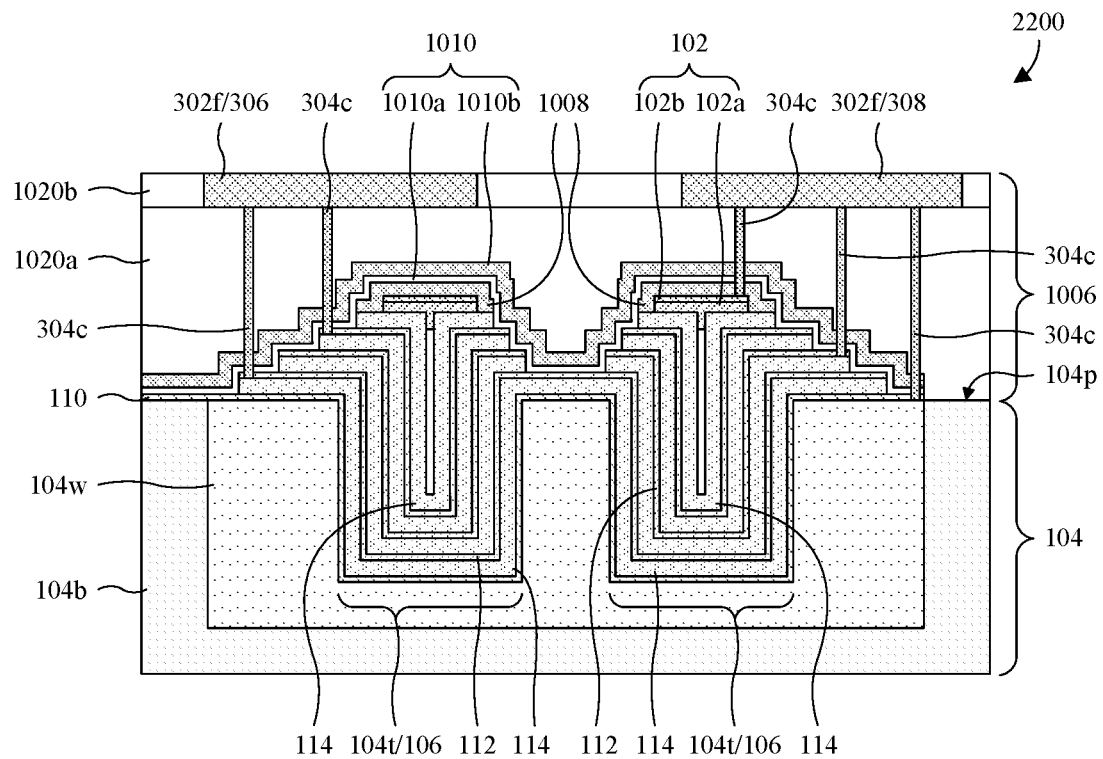

As illustrated by the cross-sectional view 2200 of FIG. 22, the etch stop structure 1010 and the dielectric liner layer 110 are patterned to partially clear the etch stop structure 1010 and the dielectric liner layer 110 from a portion 104*p* of the substrate 104. In some embodiments, a process for patterning the etch stop structure 1010 and the dielectric liner layer 110 comprises: 1) forming a mask (not shown) over the etch stop structure 1010; 2) performing an etch into the etch stop structure 1010 and the dielectric liner layer 110 with the mask in place; and 3) removing the mask. Other processes are, however, amenable. The mask may be or comprise, for example, photoresist, silicon oxide, silicon nitride, some other suitable mask material, or any combination of the foregoing. Further, the mask may, for example, be formed using photolithography or some other suitable process.

Also illustrated by the cross-sectional view 2200 of FIG. 22, an interconnect structure 1006 is formed over the etch stop structure 1010. The interconnect structure 1006 comprises an inter-layer dielectric (ILD) layer 1020a and an IMD layer 1020b overlying the ILD layer 1020a. The ILD layer 1020a and/or the IMD layer 1020b may be or comprise, for example, oxide, a low k dielectric material, some other suitable dielectric(s), or any combination of the foregoing. Further, the interconnect structure 1006 comprises a plurality of first-level wires 302f and a plurality of contact vias 304c.

The plurality of first-level wires 302f and the plurality of contact vias 304c are alternatingly stacked respectively in the IMD layer 1020b and the ILD layer 1020a. The plurality of first-level wires 302f comprises a first capacitor wire 306 and a second capacitor wire 308. The contact vias 304c extend respectively from the first and second capacitor wires 306, 308 respectively to the in-trench capacitor electrodes 114 and the well region 104w. Further, at least one of the contact vias 304c extends from the second capacitor wire 308 to an underlying one of the conductive cap structures 102. Note that only one of conductive cap structures 102 is labeled. Because the conductive cap structures 102 are conductive, the conductive cap structures 102 do not act as electrical barriers. Hence, a junction between a conductive cap structure and a contact via has a low resistance, which improves the power efficiency of the electrical coupling and the reliability of the electrical coupling.

In some embodiments, a process for forming the interconnect structure 1006 comprises: 1) forming the contact vias 304c by a single damascene process; and 2) subsequently forming the first-level wires 302f by the single damascene process. Other processes for forming the interconnect structure 1006 are, however, amenable. In some embodiments, the single damascene process comprises: 1) depositing a dielectric layer (e.g., the ILD layer 1020a or the IMD layer 1020b); 2) performing a planarization to flatten a top surface of the dielectric layer; 3) patterning the dielectric layer with openings for a single level of conductive features (e.g., a level of vias or a level of wires); 4) and filling the openings with conductive material to form the single level of conductive features. Other single damascene processes are, however, amenable. The patterning of the dielectric layer may, for example, be performed by a photolithography/etching process or some other suitable patterning process. The filling of the openings may, for example, comprise depositing a conductive layer in the openings and performing a planarization until the dielectric layer is reached. The planarization for the dielectric layer and/or the conductive layer may, for example, be performed by a chemical mechanical polish (CMP) or some other suitable planarization process.

While FIGS. 11-22 are described with reference to a method, it will be appreciated that the structures shown in FIGS. 11-22 are not limited to the method but rather may stand alone separate of the method. Further, while FIGS. 11-22 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 23:
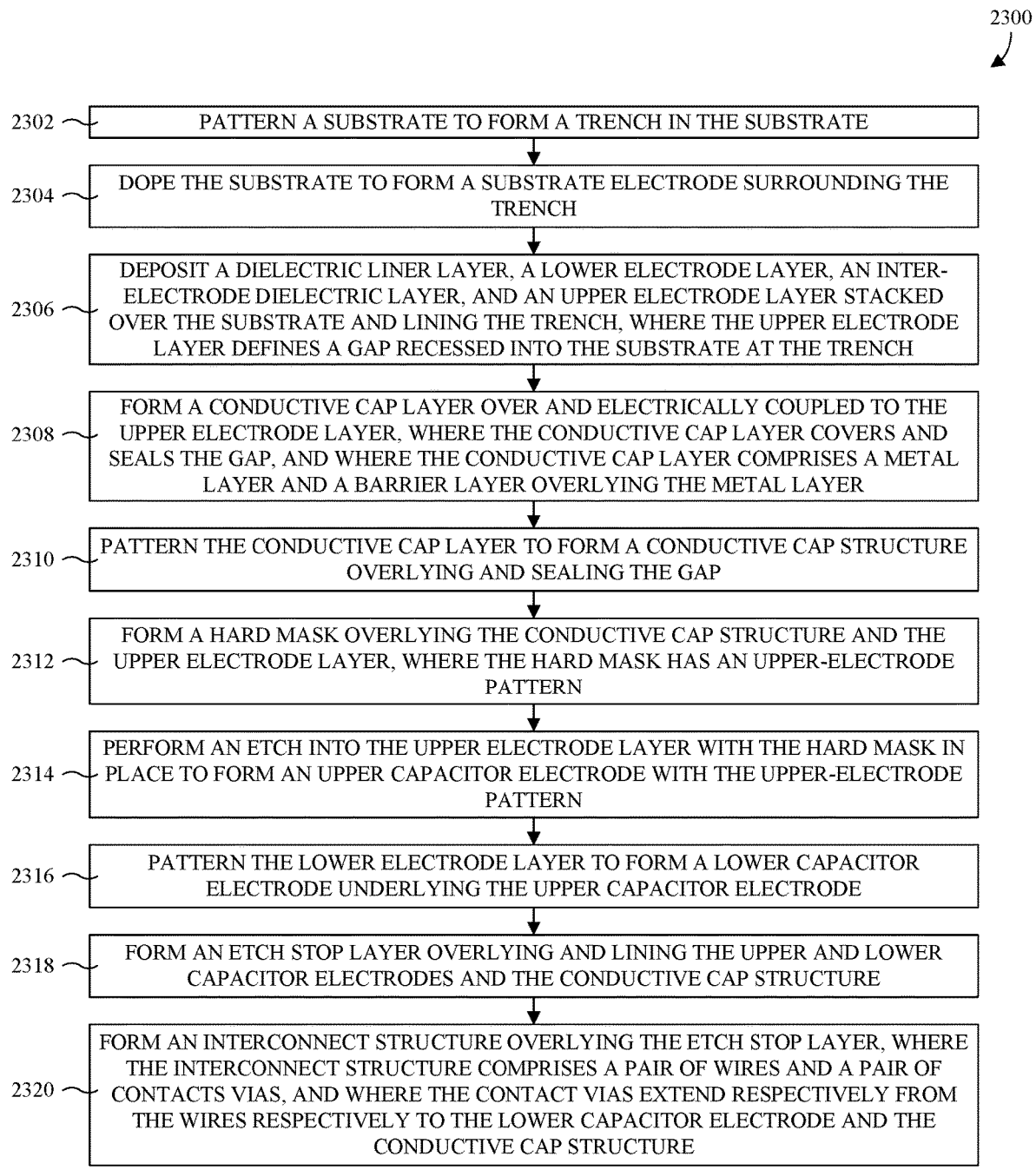
FIG. 23 illustrates a block diagram of some embodiments of the method of FIGS. 11-22.

With reference to FIG. 23, a block diagram 2300 of some embodiments of the method of FIGS. 11-22 is provided.

At 2302, a substrate is patterned to form a trench in the substrate. See, for example, FIG. 11.

At 2304, the substrate is doped to form a well region surrounding the trench. See, for example, FIG. 12.

At 2306, a dielectric liner layer, a lower electrode layer, an inter-electrode dielectric layer, and an upper electrode layer are formed stacked over the substrate and lining the trench, where the upper electrode layer defines a gap recessed into the substrate at the trench. See, for example, FIG. 13.

At 2308, a conductive cap layer is formed over and electrically coupled to the upper electrode layer, where the conductive cap layer covers and seals the gap, and where the conductive cap layer comprises a metal layer and a barrier layer overlying the metal layer. See, for example, FIG. 14. In some embodiments, the metal layer is formed by PVD and the barrier layer is formed by MOCVD. Other deposition processes are, however, amenable. In some embodiments, the metal layer is or comprises titanium, titanium nitride, tantalum nitride, or some other suitable material and/or the barrier layer is or comprises titanium nitride and/or tantalum nitride. Other materials are, however, amenable for the metal layer and/or the barrier layer.

At 2310, the conductive cap layer is patterned to form a conductive cap structure overlying and sealing the gap. See, for example, FIG. 15.

At 2312, a hard mask is formed overlying the conductive cap structure and the upper electrode layer, where the hard mask has an upper-electrode pattern. See, for example, FIGS. 16 and 17.

At 2314, an etch is performed into the upper electrode layer with the hard mask in place to form an upper capacitor electrode with the upper-electrode pattern. See, for example, FIG. 17.

At 2316, the lower electrode layer is patterned to form a lower capacitor electrode underlying the upper capacitor electrode. See, for example, FIGS. 18-20.

At 2318, an etch stop layer is formed overlying and lining the upper and lower capacitor electrodes and the conductive cap structure. See, for example, FIG. 21.

At 2320, an interconnect structure is formed overlying the etch stop layer, where the interconnect structure comprises a pair of wires and a pair of contacts vias, and where the contact vias extend respectively from the wires respectively to the lower capacitor electrode and the conductive cap structure. See, for example, FIG. 22.

While the block diagram 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a semiconductor structure including: a substrate; a trench capacitor including a lower capacitor electrode, a capacitor dielectric layer overlying the lower capacitor electrode, and an upper capacitor electrode overlying the capacitor dielectric layer, wherein the capacitor dielectric layer and the upper capacitor electrode are depressed into the substrate and define a gap sunken into the substrate; and a conductive cap structure on the upper capacitor electrode, wherein conductive cap structure overlies and seals the gap. In some embodiments, the conductive cap structure includes a titanium layer and a titanium nitride layer overlying the titanium layer. In some embodiments, the conductive cap structure includes a metal layer and a conductive barrier layer overlying the metal layer, wherein the conductive barrier layer and the upper capacitor electrode include the same material. In some embodiments, the conductive cap structure partially fills the gap. In some embodiments, the conductive cap structure has a T-shaped profile. In some embodiments, a bottom surface of the conductive cap structure is indented in the gap. In some embodiments, the lower capacitor electrode is a doped region of the substrate. In some embodiments, the semiconductor structure further includes: a conductive wire overlying the trench capacitor; and a contact via extending from the conductive wire to direct contact with the conductive cap structure.

In some embodiments, the present application provides an integrated chip including: a substrate; a trench capacitor including a plurality of in-trench electrodes and a plurality of capacitor dielectric layers stacked over the substrate, wherein the in-trench electrodes and the capacitor dielectric layers define a first trench segment and a second trench segment protruding into the substrate and further define a first cavity and a second cavity recessed into the substrate respectively at the first and second trench segments; and a first conductive cap structure overlying the trench capacitor at the first trench segment, wherein the first conductive cap structure partially fills and hermetically seals the first cavity. In some embodiments, the first conductive cap structure includes a metal layer and a conductive oxygen barrier layer overlying the metal layer. In some embodiments, the first conductive cap structure overlies the trench capacitor at the second trench segment, wherein the first conductive cap structure partially fills and hermetically seals the second cavity. In some embodiments, the integrated chip further includes a hard mask overlying the first conductive cap structure, wherein the hard mask has a hard mask sidewall aligned to a cap structure sidewall of the first conductive cap structure; a wire overlying the hard mask; and a contact via extending from the wire, through the hard mask, to the first conductive cap structure. In some embodiments, the first conductive cap structure is electrically floating. In some embodiments, the in-trench electrodes and the capacitor dielectric layers define a plurality of trench segments, including the first and second trench segments, wherein the trench segments are in a plurality of rows and a plurality of columns. In some embodiments, the trench capacitor decreases in width at each of the first and second trench segments.

In some embodiments, the present application provides a method for forming a trench capacitor, the method including: patterning a substrate to form a first trench; forming a dielectric layer overlying the substrate and lining the first trench; forming an electrode layer overlying the dielectric layer and lining the first trench over the dielectric layer, wherein the electrode layer defines a first gap; forming a conductive cap layer over the electrode layer, wherein the conductive cap layer covers and seals the first gap without filling the first gap; patterning the conductive cap layer to form a first conductive cap structure overlying and sealing the first gap; and patterning the electrode layer to form a first upper capacitor electrode underlying the first conductive cap structure. In some embodiments, the forming of the conductive cap layer includes: depositing a metal layer overlying the electrode layer and the first gap by PVD; and depositing a metal nitride layer overlying the metal layer by MOCVD. In some embodiments, the patterning of the substrate further forms a second trench neighboring the first trench, wherein the dielectric layer and the electrode layer further line the second trench and define a second gap, and wherein the patterning of the conductive cap layer further forms a second conductive cap structure overlying and hermetically sealing the second gap. In some embodiments, the patterning of the electrode layer includes: depositing a hard mask layer on the electrode layer and the first conductive cap structure; patterning the hard mask layer with a pattern of the upper capacitor electrode; and performing an etch into the electrode layer with the hard mask layer in place. In some embodiments, the method further includes doping the substrate to form a doped well region, wherein the first trench is formed in the doped well region and the doped well region defines a lower capacitor electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
 a substrate;
 a trench capacitor comprising a lower capacitor electrode, a capacitor dielectric layer overlying the lower capacitor electrode, and an upper capacitor electrode overlying the capacitor dielectric layer, wherein the capacitor dielectric layer and the upper capacitor electrode are depressed into the substrate and define an air-filled gap sunken into the substrate; and
 a conductive cap structure on the upper capacitor electrode, wherein conductive cap structure overlies and seals the air-filled gap,
 wherein the air-filled gap extends from a bottom surface of the conductive cap structure to a laterally-extending surface of the upper capacitor electrode.

2. The semiconductor structure according to claim 1, wherein the conductive cap structure comprises a titanium layer and a titanium nitride layer overlying the titanium layer.

3. The semiconductor structure according to claim 1, wherein the conductive cap structure comprises a metal layer and a conductive barrier layer overlying the metal layer, and wherein the conductive barrier layer and the upper capacitor electrode comprise the same material.

4. The semiconductor structure according to claim 1, wherein the conductive cap structure is exposed to the air-filled gap.

5. The semiconductor structure according to claim 1, wherein the conductive cap structure has a T-shaped profile.

6. The semiconductor structure according to claim 1, wherein a bottom surface of the conductive cap structure is indented and is exposed to the air-filled gap.

7. The semiconductor structure according to claim 1, wherein the lower capacitor electrode is a doped region of the substrate.

8. The semiconductor structure according to claim 1, further comprising:
   a conductive wire overlying the trench capacitor; and
   a contact via extending from the conductive wire to direct contact with the conductive cap structure.

9. An integrated chip comprising:
   a substrate;
   a trench capacitor comprising a plurality of in-trench electrodes and a plurality of capacitor dielectric layers stacked over the substrate, wherein the in-trench electrodes and the capacitor dielectric layers define a first trench segment and a second trench segment protruding into the substrate and further define a first gas-filled cavity and a second gas-filled cavity recessed into the substrate respectively at the first and second trench segments; and
   a conductive cap structure overlying the trench capacitor and the first gas-filled cavity at the first trench segment, wherein the conductive cap structure hermetically seals the first gas-filled cavity, and wherein inner sidewalls of an in-trench electrode of the plurality of in-trench electrodes and a bottom surface of the conductive cap structure are exposed to the first gas-filled cavity.

10. The integrated chip according to claim 9, wherein the conductive cap structure comprises a metal layer and a conductive oxygen barrier layer overlying the metal layer.

11. The integrated chip according to claim 9, wherein the conductive cap structure overlies the trench capacitor at the second trench segment, and wherein the conductive cap structure hermetically seals the second gas-filled cavity.

12. The integrated chip according to claim 9, further comprising:
   a hard mask overlying the conductive cap structure;
   a wire overlying the hard mask; and
   a contact via extending from the wire, through the hard mask, to the first conductive cap structure.

13. The integrated chip according to claim 9, wherein the conductive cap structure is electrically floating.

14. The integrated chip according to claim 9, wherein the in-trench electrodes and the capacitor dielectric layers define a plurality of trench segments, including the first and second trench segments, and wherein the trench segments are in a plurality of rows and a plurality of columns.

15. The integrated chip according to claim 9, wherein the trench capacitor decreases in width at each of the first and second trench segments.

16. A method for forming a trench capacitor, the method comprising:
   patterning a substrate to form a first trench;
   forming a dielectric layer overlying the substrate and lining the first trench;
   forming an electrode layer overlying the dielectric layer and lining the first trench over the dielectric layer;
   forming a conductive cap layer over the electrode layer, wherein the conductive cap layer and the electrode layer define a first air-filled gap localized over the electrode layer;
   patterning the conductive cap layer to form a first conductive cap structure overlying and sealing the first air-filled gap, wherein a bottommost surface of the first conductive cap structure is above an uppermost surface of the substrate and is exposed to the first air-filled gap; and
   patterning the electrode layer to form an upper capacitor electrode underlying the first conductive cap structure.

17. The method according to claim 16, wherein the forming of the conductive cap layer comprises:
   depositing a metal layer overlying the electrode layer and the first air-filled gap by physical vapor deposition (PVD); and
   depositing a metal nitride layer overlying the metal layer by metal-organic chemical vapor deposition (MOCVD).

18. The method according to claim 16, wherein the patterning of the substrate further forms a second trench neighboring the first trench, wherein the dielectric layer and the electrode layer further line the second trench, wherein the electrode layer and the conductive cap layer further define a second air-filled gap, and wherein the patterning of the conductive cap layer further forms a second conductive cap structure overlying and hermetically sealing the second air-filled gap.

19. The method according to claim 16, wherein the patterning of the electrode layer comprises:
   depositing a hard mask layer on the electrode layer and the first conductive cap structure;
   patterning the hard mask layer with a pattern of the upper capacitor electrode; and
   performing an etch into the electrode layer with the hard mask layer in place.

20. The method according to claim 16, further comprising:
   doping the substrate to form a doped well region, wherein the first trench is formed in the doped well region and the doped well region defines a lower capacitor electrode.

* * * * *